United States Patent
Lee et al.

(10) Patent No.: US 10,236,414 B2
(45) Date of Patent: Mar. 19, 2019

(54) SEMICONDUCTOR LIGHT EMITTING DEVICE AND METHOD OF MANUFACTURING THE SAME

(71) Applicant: SAMSUNG ELECTRONICS CO., LTD., Suwon-si, Gyeonggi-do (KR)

(72) Inventors: Dong Yul Lee, Yongin-si (KR); Jung Kyu Park, Seoul (KR); Jae Sung Hyun, Suwon-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/718,484

(22) Filed: Sep. 28, 2017

(65) Prior Publication Data
US 2018/0145216 A1    May 24, 2018

(30) Foreign Application Priority Data
Nov. 24, 2016 (KR) .................. 10-2016-0157666

(51) Int. Cl.
*H01L 33/24* (2010.01)
*H01L 33/00* (2010.01)
(Continued)

(52) U.S. Cl.
CPC .......... *H01L 33/24* (2013.01); *H01L 33/0075* (2013.01); *H01L 33/06* (2013.01); *H01L 33/32* (2013.01); *H01L 33/405* (2013.01); *H01L 33/44* (2013.01); *H01L 33/46* (2013.01); *H01L 33/007* (2013.01); *H01L 33/0079* (2013.01); *H01L 33/025* (2013.01); *H01L 33/42* (2013.01);
(Continued)

(58) Field of Classification Search
CPC ..... H01L 33/24; H01L 33/42; H01L 33/0075; H01L 33/32; H01L 33/46; H01L 33/06; H01L 33/44; H01L 2933/0058
See application file for complete search history.

(56) References Cited

U.S. PATENT DOCUMENTS 7,482,189 B2   1/2009  Lee et al.
8,129,711 B2   3/2012  Kang et al.
(Continued)

FOREIGN PATENT DOCUMENTS

JP    5050574 B2     8/2012
JP    2016-046411 A  4/2016
(Continued)

OTHER PUBLICATIONS

Shen, et al. "Optical cavity effects in InGaN/GaN quantum-well-heterostructure flip-chip light-emitting diodes," Appl. Phys. Lett. 82, 2221 (2003).

*Primary Examiner* — Julia Slutsker
(74) *Attorney, Agent, or Firm* — Lee & Morse, P.C.

(57) ABSTRACT

A semiconductor light emitting device and a method of manufacturing a semiconductor light emitting device, the device including a first conductive semiconductor layer including a plurality of V-shaped recesses; an active layer on the first conductive semiconductor layer along a shape of the plurality of V-shaped recesses; a second conductive semiconductor layer on the active layer; a reflection assisting layer on the second conductive semiconductor layer; and a reflection layer on the reflection assisting layer, wherein a thickness of the second conductive semiconductor layer is 45 nm to 100 nm.

14 Claims, 20 Drawing Sheets

(51) Int. Cl.
*H01L 33/06* (2010.01)
*H01L 33/32* (2010.01)
*H01L 33/44* (2010.01)
*H01L 33/46* (2010.01)
*H01L 33/40* (2010.01)
*H01L 33/42* (2010.01)
*H01L 33/02* (2010.01)
*H01L 33/48* (2010.01)
*H01L 33/62* (2010.01)

(52) U.S. Cl.
CPC ............ *H01L 33/486* (2013.01); *H01L 33/62* (2013.01); *H01L 2933/0058* (2013.01)

(56) References Cited

U.S. PATENT DOCUMENTS

| | | |
|---|---|---|
| 9,337,391 B2 | 5/2016 | Jean et al. |
| 9,368,678 B2 | 6/2016 | Yamane et al. |
| 2005/0035354 A1* | 2/2005 | Lin .................. H01L 33/42 257/79 |
| 2009/0001389 A1 | 1/2009 | Wang et al. |
| 2013/0026446 A1* | 1/2013 | Han .................. H01L 33/06 257/13 |
| 2016/0005919 A1 | 1/2016 | Obata |
| 2016/0043279 A1* | 2/2016 | Jean .................. H01L 33/325 257/13 |
| 2017/0201072 A1* | 7/2017 | Kotani .............. H01S 5/3202 |
| 2018/0062031 A1* | 3/2018 | Hirai ................ H01L 33/06 |
| 2018/0076362 A1* | 3/2018 | Jeon ................. H01L 33/46 |

FOREIGN PATENT DOCUMENTS

| | | |
|---|---|---|
| KR | 10-0809215 B2 | 2/2008 |
| KR | 10-1228983 B2 | 1/2013 |
| KR | 10-2014-0046163 A | 4/2014 |
| KR | 10-2014-0090282 A | 7/2014 |
| KR | 10-2014-0142849 A | 12/2014 |
| KR | 10-2015-0065411 A | 6/2015 |
| KR | 10-2015-0092415 A | 8/2015 |

* cited by examiner

FIG. 11
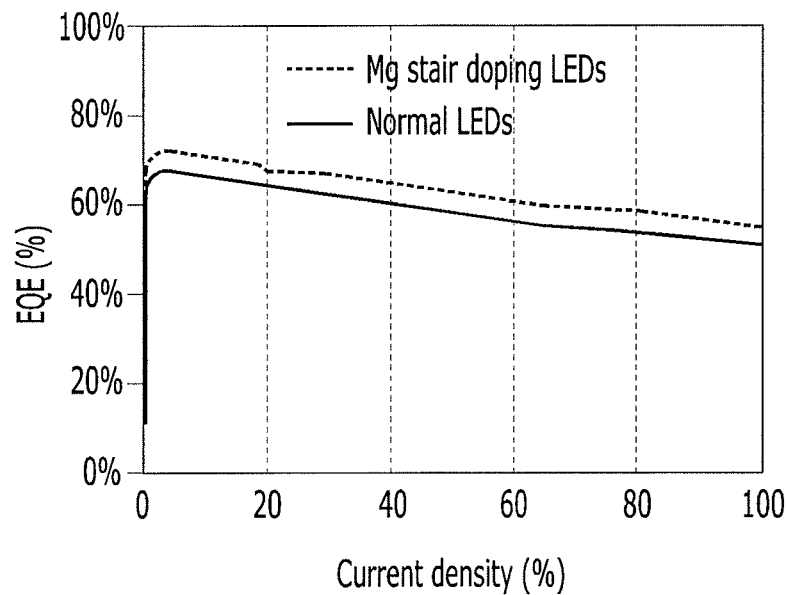
(a)
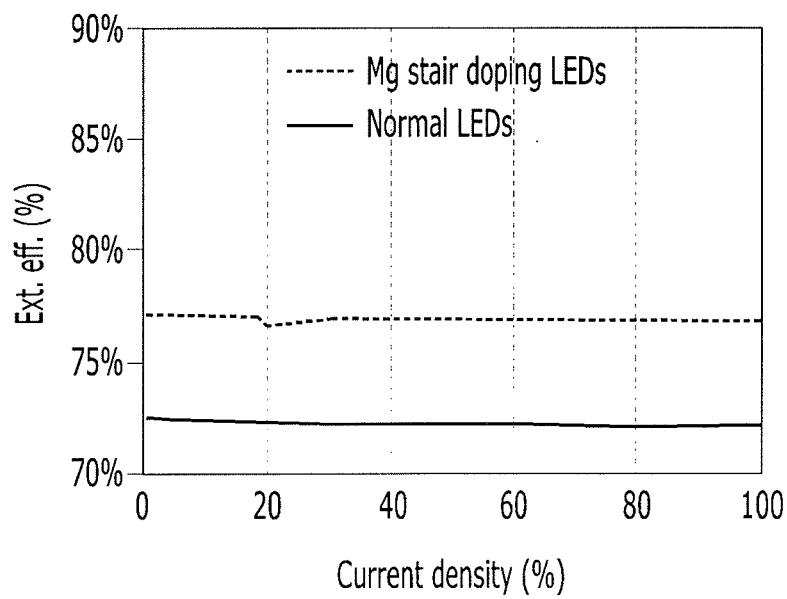
(b)

SEMICONDUCTOR LIGHT EMITTING DEVICE AND METHOD OF MANUFACTURING THE SAME

CROSS-REFERENCE TO RELATED APPLICATION

Korean Patent Application No. 10-2016-0157666 filed in the Korean Intellectual Property Office on Nov. 24, 2016, and entitled: "Semiconductor Light Emitting Device and Method of Manufacturing the Same," is incorporated by reference herein in its entirety.

BACKGROUND

1. Field

Embodiments relate to a semiconductor light emitting device and a method of manufacturing the semiconductor light emitting device.

2. Description of the Related Art

A semiconductor light emitting device is a semiconductor device, which may generate light by a recombination of electrons and holes in a junction portion of p-type and n-type semiconductors when a current is applied. The semiconductor light emitting device has various advantages, such as a long life, low power consumption, an excellent initial driving characteristic, and high vibration resistance, compared to a light emitting device based on a filament, so that a demand thereof is continuously increased. For example, a Ill-nitride semiconductor, which is capable of emitting light in a short wavelength region based on a blue color, has been recently in the limelight.

SUMMARY

The embodiments may be realized by providing a semiconductor light emitting device including a first conductive semiconductor layer including a plurality of V-shaped recesses; an active layer on the first conductive semiconductor layer along a shape of the plurality of V-shaped recesses; a second conductive semiconductor layer on the active layer; a reflection assisting layer on the second conductive semiconductor layer; and a reflection layer on the reflection assisting layer, wherein a thickness of the second conductive semiconductor layer is 45 nm to 100 nm.

The embodiments may be realized by providing a method of manufacturing a semiconductor light emitting device, the method including forming a first conductive semiconductor layer including a plurality of V-shaped recesses; forming an active layer by alternately growing a plurality of quantum well layers and a plurality of quantum barrier layers on the first conductive semiconductor layer; and forming a second conductive semiconductor layer on the active layer, wherein the plurality of quantum barrier layers is grown at a temperature of 850° C. to 1,000° C. at a speed of 0.03 Å/sec to 0.05 Å/sec.

The embodiments may be realized by providing a semiconductor light emitting device including a first conductive semiconductor layer; an active layer on the first conductive semiconductor layer; a second conductive semiconductor layer on the active layer; a reflection assisting layer on the second conductive semiconductor layer; and a reflection layer on the reflection assisting layer, wherein a thickness of the second conductive semiconductor layer in nm (T), a refractive index of a material of the second conductive semiconductor layer (n), and a wavelength of light emitted by the active layer in nm ($\lambda$) satisfy the following relation: $0.2<((T\times n)/\lambda)<0.4$.

BRIEF DESCRIPTION OF THE DRAWINGS

Features will be apparent to those of skill in the art by describing in detail exemplary embodiments with reference to the attached drawings in which:

FIG. 11 illustrates a graph showing external quantum efficiency and extraction efficiency of semiconductor light emitting devices according to an Example and a Comparative Example of FIG. 10.

DETAILED DESCRIPTION

A semiconductor light emitting device according to the present disclosure, and a method of manufacturing the semiconductor light emitting device will be described with reference to the drawings.

Figure 1:
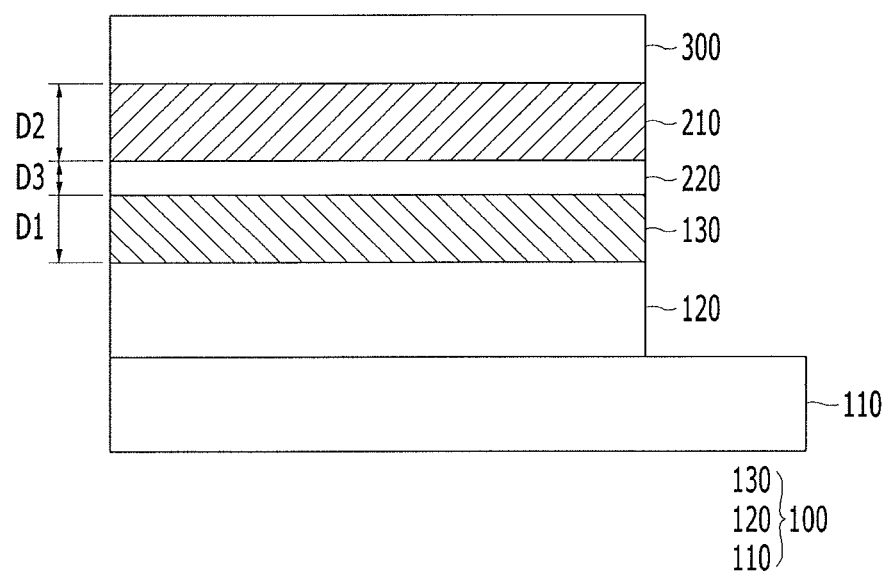
FIG. 1 illustrates a diagram of a part of a cross-section of a semiconductor light emitting device according to an exemplary embodiment.

First, a semiconductor light emitting device according to an exemplary embodiment will be described with reference to FIG. 1. FIG. 1 illustrates a part of a cross-section of a semiconductor light emitting device according to an exemplary embodiment. FIG. 1 schematically illustrates a structure of a semiconductor light emitting device based on core parts, and a particular structure will be separately described below.

Referring to FIG. 1, a semiconductor light emitting device according to an exemplary embodiment may include a first conductive semiconductor layer 110, an active layer 120 on the first conductive semiconductor layer, a second conductive semiconductor layer 130 on the active layer, a reflection assisting layer 210 on the second conductive semiconductor layer, and a reflection layer 300 on the reflection assisting layer 210. A thickness of the second conductive semiconductor layer 130 may be, e.g., 45 nm to 100 nm.

In an implementation, the thickness of the second conductive semiconductor layer 130 may be, e.g., 45 nm to 80 nm. In an implementation, the thickness of the second conductive semiconductor layer 130 may be, e.g., 45 nm to 60 nm.

In an implementation, the thickness of the second conductive semiconductor layer 130 may satisfy Equation 1 below.

$$0.2 < \frac{\text{thickness second conductive semiconductor layer (nm)} \times \text{refractive index of second conductive semiconductor layer}(n_2)}{\text{wavelength emitted in active layer (nm)}} < 0.4$$

[Equation 1]

In an implementation, a transparent conductive layer 220 may be included between the reflection assisting layer 210 and the second conductive semiconductor layer 130.

In the present disclosure, the first conductive semiconductor layer 110, the active layer 120, and the second conductive semiconductor layer 130 may form a light emitting structure 100. For example, the semiconductor light emitting device may include the reflection layer 300 on the light emitting structure 100, and the reflection assisting layer 210 may be between the reflection layer 300 and the light emitting structure 100 to help minimize reflection by the reflection layer 300. In an implementation, the second conductive semiconductor layer 130 of the light emitting structure 100 may have a thickness of 45 nm to 100 nm, so that light reflected by the reflection layer 300 may not be absorbed inside the second conductive semiconductor layer 130 and light extraction efficiency may be increased.

The first conductive semiconductor layer 110 may be an n-type semiconductor layer, and the second conductive semiconductor layer 130 may be a p-type semiconductor layer. In an implementation, the first conductive semiconductor layer 110 and the second conductive semiconductor layer 130 may include a nitride semiconductor. The first conductive semiconductor layer 110 and the second conductive semiconductor layer 130 may have an empirical formula, $Al_xIn_yGa_{(1-x-y)}N$ (herein, $0<x<1$, $0<y<1$, $0<x+y<1$). The first conductive semiconductor layer 110 and the second conductive semiconductor layer 130 may include, e.g., GaN, AlGaN, or InGaN. In an implementation, the first conductive semiconductor layer 110 may include an n-type doped nitride semiconductor material, and the second conductive semiconductor layer 130 may include a p-type doped nitride semiconductor material. For example, the first conductive semiconductor layer 110 may include n-type doped GaN, and the second conductive semiconductor layer 130 may include p-type doped GaN.

The second conductive semiconductor layer 130 may include p-type doped GaN and may have a multi-layer structure. For example, the second conductive semiconductor layer 130 may include a first layer, a second layer, and a third layer, and the first layer may be adjacent to the active layer 120, the third layer may be adjacent to the reflection assisting layer 210, and the second layer may be between the first layer and the third layer. The first layer may include an electron barrier layer that helps prevent p-type doped GaN and electrons from moving, and may have a thickness of 10 nm to 15 nm. The second layer may include p-type doped GaN, and may have a thickness of 15 nm to 25 nm. The third layer may include p-type more doped GaN (p+ GaN) than other layers, and may have a thickness of 20 nm to 25 nm. In this case, the thicknesses of the first layer, the second layer, and the third layer may be thicknesses for maintaining optimum performance of the respective layers. Maintaining the thickness of the third layer including p-type more doped GaN (p+ GaN) at 20 nm or greater may help ensure that contact resistance is not increased, thereby preventing an excessive increase in driving voltage.

For example, the first layer, a sum of minimum thicknesses of the first layer, the second layer, and the third layer included in the second conductive semiconductor layer 130 may be 45 nm, and accordingly, a minimum thickness of the second conductive semiconductor layer 130 may also be 45 nm or more.

The active layer 120 may emit light having predetermined energy by a recombination of electrons and holes, and may have a multiple quantum well (MQW) structure, in which a quantum well layer and a quantum barrier layer are alternately laminated.

The multiple quantum well structure may have an InGaN/GaN structure.

The reflection layer 300 may be on the light emitting structure 100 including the first conductive semiconductor layer 110, the active layer 120, and the second conductive semiconductor layer 130. The reflection layer 300 may reflect light generated in the light emitting structure 100 and may emit or direct the reflected light to an upper surface of the first conductive semiconductor layer 110.

The reflection layer 300 may include, e.g., silver, aluminum, rhodium, palladium, gold, chromium, titanium, copper, or an alloy thereof. In an implementation, the reflection layer 300 may include silver (Ag). In an implementation, a part of the reflection layer 300 may be electrically connected with the second conductive semiconductor layer 130 and may supply a voltage to the second conductive semiconductor layer 130. A particular voltage application structure will be separately described below.

The reflection assisting layer 210 may be between the light emitting structure 100 and the reflection layer 300. The reflection assisting layer 210 may have a lower refractive index than that of the second conductive semiconductor layer 130. The reflection assisting layer 210 may include, e.g., silicon dioxide ($SiO_2$), silicon nitride ($Si_3N_4$), or magnesium fluoride ($MgF_2$). The reflection assisting layer 210 may induce constructive interference of light reflected at an interface of the reflection assisting layer 210 and the reflection layer 300 and light totally reflected between the second conductive semiconductor layer 130 and the reflection assisting layer 210, and may help improve light extraction efficiency.

Figure 2:
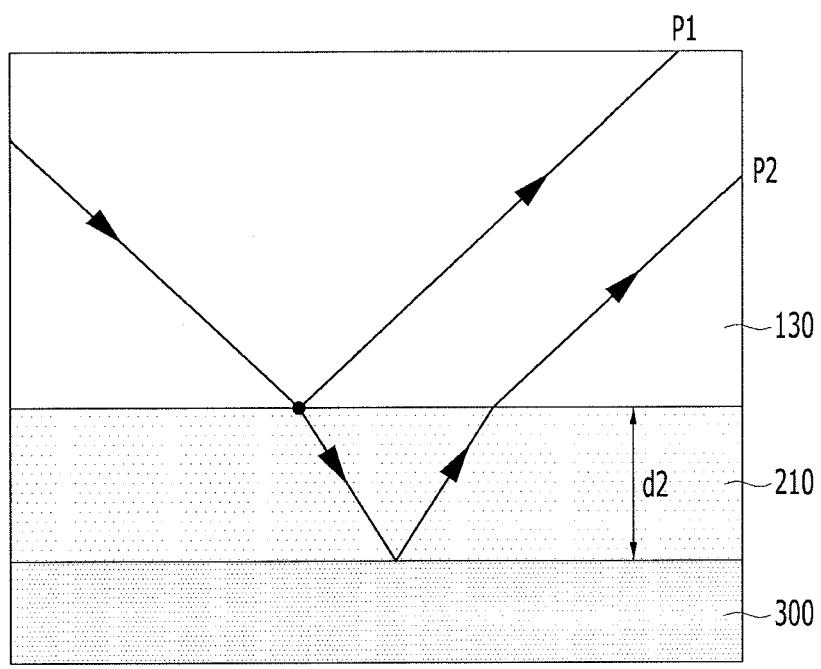
FIG. 2 illustrates a diagram of a principle of an improvement of reflectivity by a reflection assisting layer.

FIG. 2 illustrates a principle of an improvement of reflectivity by the reflection assisting layer 210. Referring to FIG. 2, the reflection assisting layer 210 including $SiO_2$ may be on the reflection layer 300 including silver (Ag). The second conductive semiconductor layer 130 including p-type doped GaN may be on the reflection assisting layer 210.

For example, a refractive index of the reflection assisting layer 210 including $SiO_2$ may be smaller than a refractive index of the second conductive semiconductor layer 130 including p-type doped GaN. Accordingly, when light incident from or transmitted through the second conductive semiconductor layer 130 is incident to the reflection assisting layer 210 at a threshold angle or more, total reflection may occur.

The totally reflected light may move along a path of P1 of FIG. 2, and light, which is not totally reflected, may be reflected from or at the interface between the reflection assisting layer 210 and the reflection layer 300 and may move along a path of P2.

Accordingly, as illustrated in FIG. 2, a path difference may be generated between P1 and P2, and when the reflection assisting layer 210 has a thickness, at which the light moving along the path of P1 constructively interferes with the light moving along the path of P2, the light moving along the path of P1 and the light moving along the path of P2 may generate constructive interference.

For example, the reflection assisting layer may have a thickness of 500 nm to 700 nm.

If the second conductive semiconductor layer 130 were to have an excessive thickness in the semiconductor light emitting device, to which the reflection assisting layer 210 is applied, the light, which passes through the reflection assisting layer 210 and is amplified, could be absorbed inside the second conductive semiconductor layer 130 again, and light extraction efficiency could be decreased.

Accordingly, in the semiconductor light emitting device, the second conductive semiconductor layer 130 may have a thickness at which efficiency of the extraction of the light reflected from the reflection layer 300 and the reflection assisting layer 210 may be maximized.

For example, a thickness D1 of the second conductive semiconductor layer 130 may satisfy Equation 1 below.

$$0.2 < \frac{\text{thickness second conductive semiconductor layer(nm)} \times \text{refractive index of second conductive semiconductor layer}(n_2)}{\text{wavelength emitted in active layer (nm)}} < 0.4$$

[Equation 1]

A value drawn from Equation 1 represents a relationship between a thickness of the second conductive semiconductor layer 130 and a wavelength of the light emitted from the active layer 120, and is also referred to as a P-cavity value. The P-cavity value is a value related to a thickness of the second conductive semiconductor layer 130, and may be increased as a thickness of the second conductive semiconductor layer 130 is increased.

For example, a P-cavity value of a semiconductor light emitting device having a structure to which the reflection assisting layer 210 is not applied may be at a level of about 0.7. The second conductive semiconductor layer 130 having the P-cavity value of 0.7 may constructively interfere the emitted light similar to the reflection assisting layer 210 of the present disclosure. For example, the second conductive semiconductor layer 130 may help improve light emission efficiency by increasing constructive interference between the light emitted from the active layer 120 in a direction of the second conductive semiconductor layer 130 and is reflected by the reflection layer 300, and the light emitted from the active layer 120 in a direction of the first conductive semiconductor layer 110. In order to increase the constructive interference, the second conductive semiconductor layer 130 may have a thickness satisfying the p-cavity value of 0.7 of the second conductive semiconductor layer 130.

The semiconductor light emitting device according to the present exemplary embodiment may include the reflection assisting layer 210, and the reflection assisting layer 210 may help increase the constructive interference within the semiconductor light emitting device. Accordingly, even though the second conductive semiconductor layer 130 may not have the thickness (P-cavity), which may induce the constructive interference, the constructive interference may still occur due to the presence of the reflection assisting layer 210. If a P-cavity value of the second conductive semiconductor layer 130 were to be 0.7, the light that constructively interferes in the reflection layer 300 and the reflection assisting layer 210 and is discharged may be absorbed inside the second conductive semiconductor layer 130 while passing through the second conductive semiconductor layer 130, and light emission efficiency could be decreased.

In the semiconductor light emitting device according to the present exemplary embodiment, a thickness of the second conductive semiconductor layer 130 may be 45 to 100 nm. A thickness of the second conductive semiconductor layer 130 may satisfy Equation 1. For example, in the semiconductor light emitting device according to the present exemplary embodiment, a P-cavity value of the second conductive semiconductor layer 130 may be 0.2 to 0.4. The second conductive semiconductor layer 130 having the aforementioned thickness may help minimize the absorption of light inside the second conductive semiconductor layer 130. Accordingly, it is possible to help improve light extraction efficiency.

For example, the thickness D1 of the second conductive semiconductor layer 130 of the semiconductor light emitting device may be 45 to 100 nm. In an implementation, the thickness D1 of the second conductive semiconductor layer 130 of the semiconductor light emitting device may be, e.g., 45 to 80 nm or 45 nm to 60 nm. In an implementation, the thickness D1 of the second conductive semiconductor layer 130 of the semiconductor light emitting device may be different according to a wavelength of emitted light. For example, when the second conductive semiconductor layer 130 includes GaN having a refractive index of 2.5 and a wavelength of light discharged from the active layer is 450 nm, a thickness of the second conductive semiconductor layer 130 may be 60 nm. In this case, a P-cavity value may be 0.33, so that the second conductive semiconductor layer 130 satisfies Equation 1.

In an implementation, referring to FIG. 1, the semiconductor light emitting device may further include the transparent conductive layer 220 between the second conductive semiconductor layer 130 and the reflection assisting layer 210. The transparent conductive layer 220 may include, e.g., an indium tin oxide (ITO), an indium zinc oxide (IZO), an aluminum zinc oxide (AZO), a gallium zinc oxide (GZO), or an indium gallium zinc oxide (IGZO). For example, the transparent conductive layer 220 may include an ITO. In the present exemplary embodiment, the transparent conductive layer 220 may disperse a current applied to the second conductive semiconductor layer 130. The transparent conductive layer 220 may also help reduce contact resistance between the second conductive semiconductor layer 130 and the reflection layer 300, and may help decrease a concentration of magnesium (Mg) doped to the second conductive semiconductor layer 130. In order to help decrease the contact resistance between the second conductive semiconductor layer 130 and the reflection layer 300, the concentration of magnesium of the second conductive semiconductor layer 130 in a region adjacent to the reflection layer 300 may be relatively larger. In the semiconductor light emitting device according to the present exemplary embodiment, the transparent conductive layer 220 may be positioned between the second conductive semiconductor layer 130 and the reflection layer 300, and it is possible to decrease the concentration of magnesium of the second conductive semiconductor layer 130. For example, a concentration of magnesium in the second conductive semiconductor layer 130 (when the transparent conductive layer 220 is not included) may be about $5 \times 10^{20}$ cm$^{-3}$. In an implementation, when the transparent conductive layer 220 is included between the second conductive semiconductor layer 130 and the reflection layer 300, the concentration of magnesium of the second conductive semiconductor layer 130 may be about $2.5 \times 10^{20}$ cm$^{-3}$. For example, when the transparent conductive layer 220 is included, the concentration of magnesium of the second conductive semiconductor layer 130 may be decreased by about 50%.

If the concentration of magnesium (Mg) within the second conductive semiconductor layer 130 were to be increased, magnesium could act as a trap, in which light may be absorbed, so that absorption of light may be increased within the second conductive semiconductor layer 130. When the transparent conductive layer 220 is included, the concentration of magnesium may be decreased to a half or less within the second conductive semiconductor layer 130, and the absorption of light by magnesium may be minimized within the second conductive semiconductor layer 130.

A thickness D3 of the transparent conductive layer 220 may be, e.g., 10 nm to 20 nm. Maintaining the thickness D3 of the transparent conductive layer 220 at 10 nm or greater helps ensure that the transparent conductive layer 220 has a sufficient contact characteristic between the second conductive semiconductor layer 130 and the reflection layer 300 is able to sufficiently disperse a current to the second conductive semiconductor layer 130, so that an operation voltage is not increased. Maintaining the thickness of the transparent conductive layer 220 at 20 nm or less may help ensure that light is not absorbed within the transparent conductive layer 220 and that efficiency is not decreased.

Figure 3:
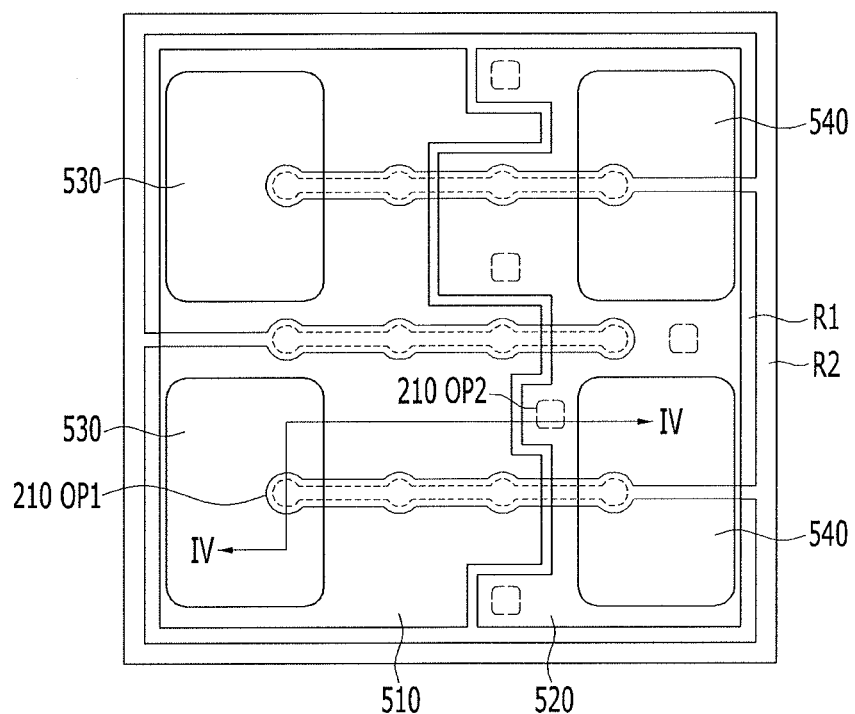
FIG. 3 illustrates a top plan view of a semiconductor light emitting device according to an exemplary embodiment.
Figure 4:
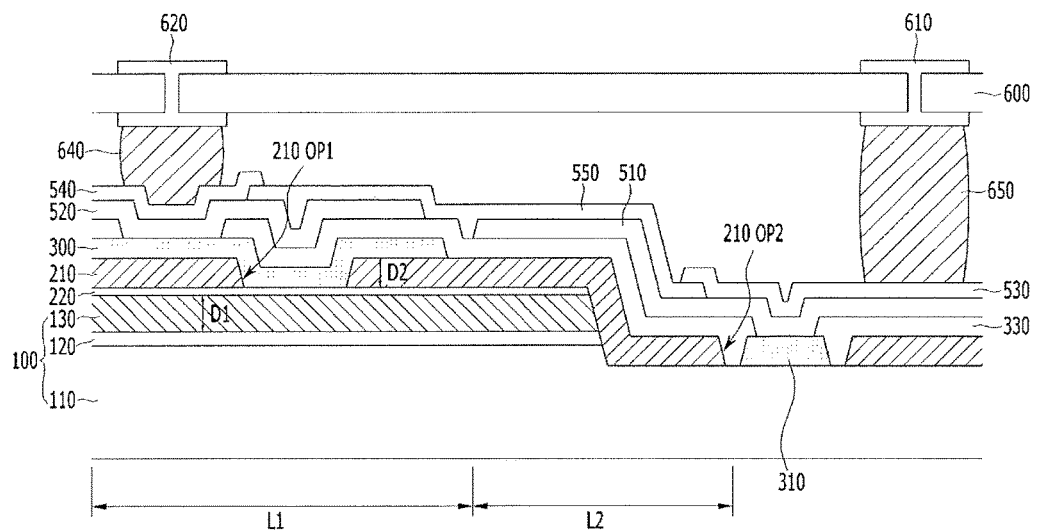
FIG. 4 illustrates a diagram of a part of a cross-section of the semiconductor light emitting device taken along line IV-IV of FIG. 3.

FIG. 3 illustrates a top plan view of a semiconductor light emitting device according to an exemplary embodiment. FIG. 4 illustrates a part of a cross-section of the semiconductor light emitting device taken along line IV-IV of FIG. 3. Referring to FIG. 3, the semiconductor light emitting device may have a first region R1, and a second region R2 surrounding the first region R1. The first region R1 may be a light emission region, in which light is generated by a recombination of electrons and holes in the active layer 120.

The semiconductor light emitting device will be described in more detail with reference to FIGS. 3 and 4. The light emitting structure 100 may include a first conductive semiconductor layer 110, an active layer 120, and a second conductive semiconductor layer 130. The active layer 120 and the second conductive semiconductor layer 130 may not be positioned in a partial region of the first conductive semiconductor layer 110. A thickness D1 of the second conductive semiconductor layer 130 may be 45 nm to 100 nm as described above, and a repeated description of the same constituent element may be omitted. A transparent conductive layer 220 may be on the second conductive semiconductor layer 130. The transparent conductive layer 220 may contact the second conductive semiconductor layer 130 over a wide area, so that it is possible to help prevent a current from being concentrated in a specific region, thereby improving light efficiency. The transparent conductive layer 220 may be on an upper surface of the second conductive semiconductor layer 130, e.g., may not contact the first conductive semiconductor layer 110.

A reflection assisting layer 210 may be on the transparent conductive layer 220. The reflection assisting layer 210 may be positioned so as to cover an upper surface and a side surface of the transparent conductive layer 220, and may also be on an upper surface of the first conductive semiconductor layer 110. A thickness D2 of the reflection assisting layer 210 may be the same as that described above. For example, a thickness of the reflection assisting layer 210 may be 500 nm to 700 nm.

The reflection assisting layer 210 may include a first opening (OP1) 210 overlapping or overlying a part of the second conductive semiconductor layer 130, and a second opening (OP2) 210 overlapping or overlying a part of the first conductive semiconductor layer 110.

The reflection layer 300 may be on the reflection assisting layer 210. The reflection layer 300 may be on an upper surface of the reflection assisting layer 210 and within the first opening (OP1) 210, and may contact the transparent conductive layer 220. The reflection layer 300 may not be in the second opening (OP2) 210 of the reflection assisting layer 210, and may not contact the first conductive semiconductor layer 110. The reflection layer 300 may be electrically connected with the second conductive semiconductor layer 130 through the transparent conductive layer 220. For example, the reflection layer 300 may be a second conductive semiconductor layer electrode supplying a voltage to the second conductive semiconductor layer 130.

A first conductive semiconductor layer electrode 310 may be in the second opening (OP2) 210. The first conductive semiconductor layer electrode 310 may include a same material as that of the reflection layer 300. The reflection layer 300 and the first conductive semiconductor layer electrode 310 may be spaced apart from each other, e.g., may not contact each other.

Referring to FIG. 4, light reflection may be generated or occur in the first region L1, in which the reflection layer 300 is positioned, by the reflection layer 300, and light reflection may be generated or occur in the second region L2, in which the reflection layer 300 is not positioned, by a first metal layer 510 which will be described below. The reflection assisting layer 210 may be included in both the first region L1 and the second region L2, and the reflected light may be amplified in the reflection assisting layer 210.

For example, reflection may occur in the portion in which the reflection layer 300 is positioned, and in the portion in which the reflection layer 300 is not included, e.g., the portion, in which the first metal layer 510 is positioned, by the electrodes. When the semiconductor light emitting device has the aforementioned structure, a reflection structure may be formed even in the non-emission region of the semiconductor light emitting device, so that it is possible to help increase the quantity of light.

An insulating layer 330 may be on the reflection layer 300 and the first conductive semiconductor layer electrode 310.

The insulating layer 330 may expose a part of the reflection layer 300 and a part of the first conductive semiconductor layer electrode 310.

The first metal layer 510 and a second metal layer 520 may be on the insulating layer 330. The first metal layer 510 may be connected with the first conductive semiconductor layer electrode 310, and the second metal layer 520 may be connected with the reflection layer 300.

A first electrode layer 530 may be on the first metal layer 510. In an implementation, a second electrode layer 540 may be on the second metal layer 520. The first electrode layer 530 and the second electrode layer 540 may each include a conductive material. The first electrode layer 530 and the second electrode layer 540 may be electrically insulated from each other through an electrode insulating layer 550.

FIG. 4 illustrates the semiconductor light emitting device including a structure in which the semiconductor light emitting device described with reference to FIGS. 1 to 3 is mounted on a package substrate 600.

Referring to FIG. 4, a plurality of through-holes may be formed in the package substrate 600, and a first through-electrode 610 and a second through-electrode 620 may be formed in the through-holes, respectively. A first solder bump 650 may be between the first through-electrode 610 and the first electrode layer 530, and may electrically connect the first through-electrode 610 and the first electrode layer 530. Similarly, a second solder bump 640 may be between the second through-electrode 620 and the second electrode layer 540, and may electrically connect the second through-electrode 620 and the second electrode layer 540. Accordingly, a first voltage supplied to the first through-electrode 610 may be transferred to the first conductive semiconductor layer electrode 310 via the first solder bump 650, the first electrode layer 530, and the first metal layer 510. The first conductive semiconductor layer electrode 310 may be connected to the first conductive semiconductor layer 110, so that the first voltage is transferred to the first conductive semiconductor layer 110.

Similarly, a second voltage supplied to the second through-electrode 620 may be transferred to the reflection layer 300 via the second solder bump 640, the second electrode layer 540, and the second metal layer 520. The reflection layer 300 may be connected with the second conductive semiconductor layer 130, so that the second voltage is transferred to the second conductive semiconductor layer 130.

Figure 5:
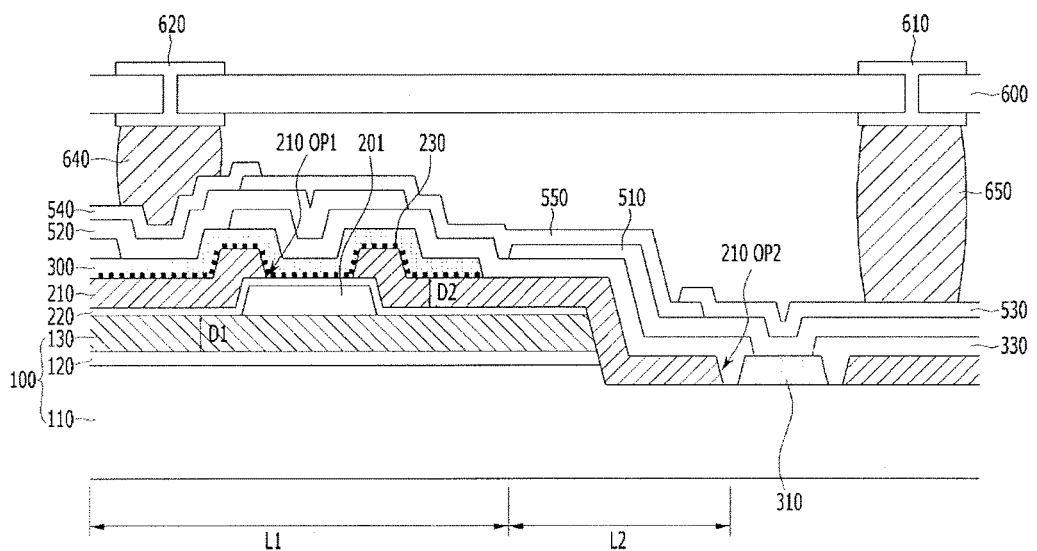
FIG. 5 illustrates a diagram of a part of a cross-section of a semiconductor light emitting device according to another exemplary embodiment.

FIG. 5 illustrates a part of a cross-section of a semiconductor light emitting device according to another exemplary embodiment. Referring to FIG. 5, the semiconductor light emitting device illustrated in FIG. 5 is similar to the semiconductor light emitting device according to the exemplary embodiment of FIG. 4. A detailed description of the same constituent element may be omitted.

Referring to FIG. 5, the semiconductor light emitting device may further include an adhesive layer 230 between the transparent conductive layer 220 and the reflection layer 300. The semiconductor light emitting device of FIG. 5 may further include a passivation pattern layer 201 between the second conductive semiconductor layer 130 and the transparent conductive layer 220.

The adhesive layer 230 may cover an upper surface of the transparent conductive layer 220, which is exposed by the first opening (OP1) in the reflection assisting layer 210, an internal surface of the first opening (OP1) of the reflection assisting layer 210, and an upper surface of the reflection assisting layer 210.

The adhesive layer 230 may include a plurality of patterns, which may be spaced apart from one another in an island arrangement as illustrated in FIG. 5, or may have a thin film structure having a predetermined thickness.

The adhesive layer 230 may include, e.g., an ITO, an IZO, an AZO, a GZO, or an IGZO. A material of the adhesive layer 230 may also be the same as or different from a material of the transparent conductive layer 220.

When the reflection layer 300 is formed on the reflection assisting layer 210 (formed of an insulating material), an adhesive force between the reflection layer 300 and the reflection assisting layer 210 could be weak, and the reflection layer 300 could be peeled from the reflection assisting layer 210. In this case, an electrical connection between the reflection layer 300 and the light emitting structure 100 could become unstable, and an operation voltage may be increased.

According to an embodiment, when the adhesive layer 230 including the material, such as an ITO, is between the reflection layer 300 and the reflection assisting layer 210, the reflection layer 300 may not be peeled from the reflection assisting layer 210 by the adhesive layer 230. Accordingly, the reflection layer 300 and the light emitting structure 100 may be stably connected, thereby preventing an operation voltage from being increased and securing reliability of the device.

As illustrated in FIG. 5, the semiconductor light emitting device may also include a passivation pattern layer 201 between the second conductive semiconductor layer 130 and the transparent conductive layer 220. The passivation pattern layer 201 may overlap or underlie the first opening (OP1) 210 of the reflection assisting layer 210, thereby preventing the light emitting structure 100 from being damaged. The passivation pattern layer 201 may have conductivity.

Figure 6:
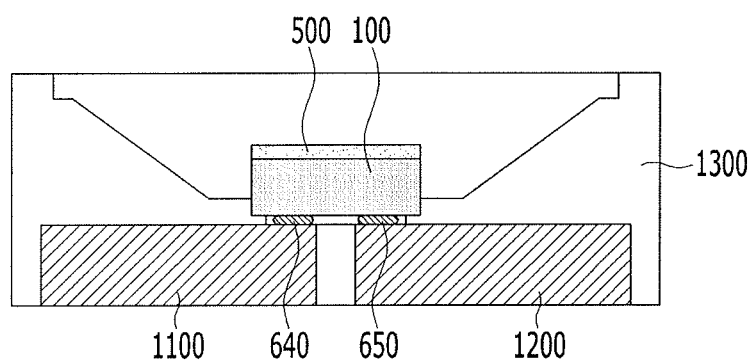
FIG. 6 illustrates a cross-sectional view of a semiconductor light emitting device package according to an exemplary embodiment.

A semiconductor light emitting device package including the semiconductor light emitting device according to the present disclosure will be described with reference to FIG. 6. Referring to FIG. 6, the semiconductor light emitting device package may include the light emitting structure 100 on a substrate 500, and may have a flip-chip structure, in which light is discharged through the substrate 500. In an implementation, the substrate 500 may be omitted.

The light emitting structure 100 may be inside a package main body 1300, and the light emitting structure 100 may be connected with a first electrode pad 1100 and a second electrode pad 1200 through a first solder bump 650 and a second solder bump 640, respectively. The first electrode pad 1100 may supply the first voltage and the first voltage may be transferred to the first conductive semiconductor layer 110 of the light emitting structure 100 as illustrated with reference to FIGS. 3 to 5, and the second electrode pad 1200 may supply a second voltage and the second voltage may be transferred to the second conductive semiconductor layer 130 of the light emitting structure 100 as illustrated with reference to FIGS. 3 to 5.

As described above, the reflection layer may be on one surface of the light emitting structure 100, and light emitted in the light emitting structure 100 may be reflected by the reflection layer and to the substrate 500.

In an implementation, a reflective material may be positioned on an inclined surface inside the package main body 1300, thereby improving efficiency of light reflection inside the package main body 1300.

Figure 7:
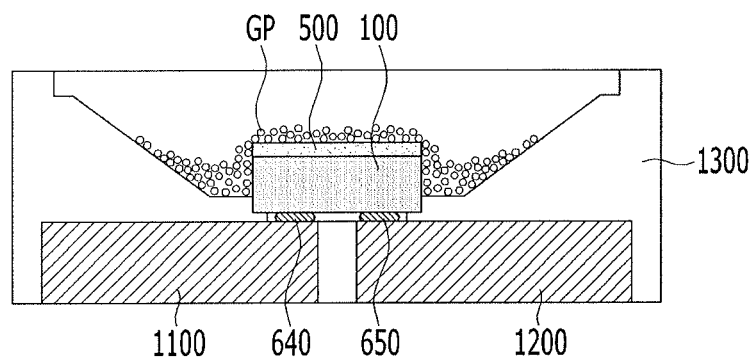
FIG. 7 illustrates a cross-sectional view of a semiconductor light emitting device package according to another exemplary embodiment.

FIG. 7 illustrates a semiconductor light emitting device package according to another exemplary embodiment. Referring to FIG. 7, the semiconductor light emitting device package may include wavelength converting particles GP inside a package main body 1300. The wavelength converting particles GP may include a wavelength converting material, e.g., a fluorescent substance or a quantum dot. A wavelength of light emitted may be adjusted according to a composition of the wavelength converting particle GP.

Figure 8:
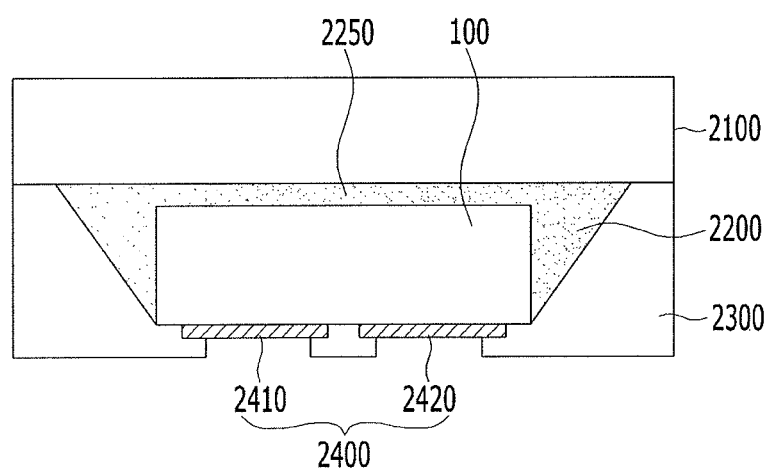
FIG. 8 illustrates a cross-sectional view of a semiconductor light emitting device package according to another exemplary embodiment.
Figure 9:
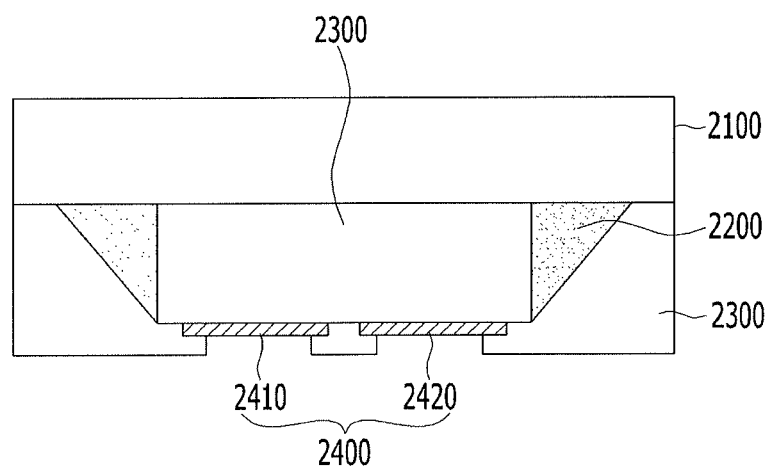
FIG. 9 illustrates a cross-sectional view of a semiconductor light emitting device package according to another exemplary embodiment.

FIG. 8 illustrates a semiconductor light emitting device package according to another exemplary embodiment. FIG. 9 illustrates a semiconductor light emitting device package according to another exemplary embodiment. Referring to FIGS. 8 and 9, the semiconductor light emitting device packages may be manufactured with the same size as that of a semiconductor light emitting device, and may not require a separate package process, thereby decreasing manufacturing cost. For example, the semiconductor light emitting device packages of FIGS. 8 and 9 may be smaller than a light emitting device package, and may form a high density to decrease cost, and may have a simple process, high thermal resistive performance, and high color uniformity.

Referring to FIG. 8, the semiconductor light emitting device package may include a light emitting structure 100, an electrode unit 2400, a transmissive part 2200, a reflection part 2300, and a wavelength converting part 2100.

First, the wavelength converting part 2100 will be described. The light emitting structure 100 may be attached to the wavelength converting part 2100, and the wavelength converting part 2100 may be a light converting sheet including a light converting material.

The light converting sheet may be pre-manufactured in a form of a sheet before a chip scale package process, and may be formed in a hard or soft plate shape manufactured in various forms having predetermined thicknesses.

For example, the wavelength converting part 2100 may include an adhesive layer or an adhesive component, and may be a sheet structure, in which naturally curable or thermally curable silicon and a fluorescent body or a quantum dot are mixed. When the wavelength converting part 2100 includes an adhesive component or is attached with the light emitting structure 100 in a semi-cured state, an adhesive part 2250 between the light emitting structure 100 and the wavelength converting part 2100 may be omitted.

The description of the light emitting structure 100 is the same as the above description. A repeated detailed description of the same constituent element may be omitted.

The transmissive part 2200 may be on a side surface of the light emitting structure 100 and between the light emitting structure 100 and the wavelength converting part 2100. The transmissive part 2200 may include a transparent resin, and may further include a scattering material, such as a fluorescent substance, in addition to the transparent resin. The transmissive part 2200 may be formed of a light transmissive encapsulating material, such as silicon or a transparent epoxy molding compound (EMC), including a transparent resin. The transmissive part 2200 may include a fluorescent material, and thus, the transmissive part 2200 may perform a function of a fluorescent substance. The transmissive part 2200 may also further include a scattering material.

The transmissive part 2200 may have an exterior wall portion, of which an internal diameter is increased as being close to the wavelength converting part 2100. For example, a side surface of the transmissive part 2200 may be inclined.

A part of the transmissive part 2200 may be between the light emitting structure 100 and the wavelength converting part 2100 to form the adhesive part 2250. For example, the resin included in the transmissive part 2200 may be an adhesive to bond the wavelength converting part 2100 and the light emitting structure 100. When the light emitting structure 100 is bonded in a state where the wavelength converting part 2100 is semi-cured, the adhesive part 2250 may be omitted.

The reflection part 2300 may be on a side surface of the transmissive part 2200, e.g., the exterior wall portion of the transmissive part 2200, and may reflect light emitted from the light emitting structure 100. The reflection part may include $TiO_2$. As illustrated in FIG. 8, a part of the reflection part 2300 may cover a lower portion of the light emitting structure 100. In an implementation, the reflection part 2300 may not cover the lower portion of the light emitting structure 100. The reflection part 2300 may also include a florescent substance.

As illustrated in FIG. 8, a contact surface of the transmissive part 2200 and the reflection part 2300 may be included. In an implementation, a contact surface may be a non-inclined structure.

An electrode 2400 may be between the reflection part 2300 and the light emitting structure 100. The electrode 2400 may include a first electrode 2410 and a second electrode 2420. The first electrode 2410 and the second electrode 2420 may be connected with the first conductive semiconductor layer 110 or the second conductive semiconductor layer 130 of the light emitting structure 100. In an implementation, a solder bump may be further positioned in the first electrode 2410 and the second electrode 2420.

FIG. 9 illustrates a semiconductor light emitting device package according to another exemplary embodiment. Most of the constituent elements of the semiconductor light emitting device package of FIG. 9 are the same as those of the semiconductor light emitting device package of FIG. 8. A repeated detailed description of the same or similar constituent element may be omitted. In the semiconductor light emitting device package of FIG. 9, an attachment part may not be positioned between a wavelength converting part 2100 and a light emitting structure 100. For example, in FIG. 9, the light emitting structure 100 may be in a semi-cured state of the wavelength converting part 2100, and a separate attachment part may be omitted.

The actual device structure and the package form of the semiconductor light emitting device have been described based on the simplest structure of the semiconductor light emitting device according to the present disclosure. Hereinafter, a semiconductor light emitting device will be described based on a part of a cross-section of the semiconductor light emitting device as illustrated in FIG. 1. The semiconductor light emitting device to be described below may also be included in the contents described with reference to FIGS. 3 to 9.

Figure 10:
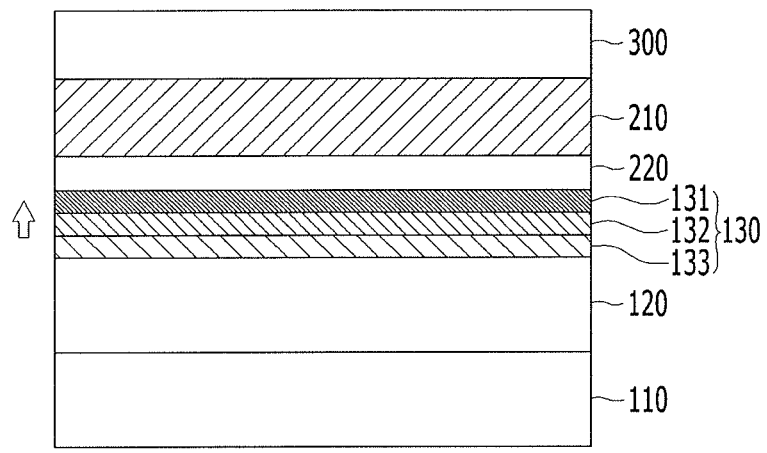
FIG. 10 illustrates a diagram of a part of a cross-section of a semiconductor light emitting device according to another exemplary embodiment.

FIG. 10 illustrates a part of a cross-section of a semiconductor light emitting device according to another exemplary embodiment. The semiconductor light emitting device of FIG. 10 may include all of the characteristics of the semiconductor light emitting devices described with reference to FIGS. 1 to 9. For example, the semiconductor light emitting device of FIG. 10 may include a reflection assisting layer 210, and a second conductive semiconductor layer 130 having a thickness of 45 nm to 100 nm. A repeated detailed description of the same constituent element may be omitted.

Referring to FIG. 10, in the semiconductor light emitting device, the second conductive semiconductor layer 130 may include magnesium doped GaN. A concentration of magnesium in the second conductive semiconductor layer 130 may increase as the second conductive semiconductor layer 130 is closer to a reflection layer 300. For example, the concentration of magnesium inside the second conductive semiconductor layer 130 may increase in a direction of an arrow illustrated in FIG. 10 (e.g., a portion of the second conductive semiconductor layer 130 proximate to the reflection layer 300 may have a higher magnesium concentration than a portion of the second conductive semiconductor layer 130 distal to the reflection layer 300).

The magnesium doped GaN represents a p-type semiconductor characteristic. In this case, in order to help decrease resistance between the second conductive semiconductor layer 130 and the reflection layer 300, magnesium may be sufficiently doped inside the second conductive semiconductor layer 130. Magnesium doped in the second conductive semiconductor layer 130 may create a trap site within a GaN energy band and may absorb discharged light, decreasing efficiency of the semiconductor light emitting device. In the semiconductor light emitting device according to the present exemplary embodiment, the concentration of magnesium doped within the second conductive semiconductor layer 130 may decrease in the second conductive semiconductor layer 130 with increasing distance from the reflection layer 300. Accordingly, it is possible to help decrease resistance between the second conductive semiconductor layer 130 and the reflection layer 300, minimize light absorption within the second conductive semiconductor layer 130, and maximize light extraction efficiency.

Referring to FIG. 10, the second conductive semiconductor layer 130 may include, e.g., three regions according to the concentration of magnesium doped. For example, the second conductive semiconductor layer 130 may include a first region 131 proximate to the reflection layer 300, a third region 133 adjacent to an active layer 120, and a second region 132 between the first region 131 and the third region 133.

The concentration of magnesium of the first region 131 may be two or more times the concentration of magnesium of the second region 132, and the concentration of magnesium of the second region 132 may be two or more times the concentration of magnesium of the third region 133. For example, the concentration of magnesium of the first region 131 may be about $3 \times 10^{20}$ cm$^{-3}$ to $5 \times 10^{20}$ cm$^{-3}$. For example, the concentration of magnesium of the second region 132 may be about $1 \times 10^{20}$ cm$^{-3}$ to $2 \times 10^{20}$ cm$^{-3}$. For example, the concentration of magnesium of the third region 133 may be about $5 \times 10^{9}$ cm$^{-3}$ to $8 \times 10^{19}$ cm$^{-3}$. In an implementation, the concentration of magnesium doped of the first region 131 may be 10 times or more of the concentration of magnesium doped of the third region 133.

In an Example and a Comparative Example, extraction efficiency (Ext.eff) and external quantum efficiency (EQE) were measured for a case in which magnesium was doped within the second conductive semiconductor layer 130 of the semiconductor light emitting device in stages (Example 1: Mg stair doping) and a case in which magnesium was uniformly doped in the entire second conductive semiconductor layer 130 at the same concentration (Comparative Example 1: Normal), and the results of the measurement are represented in FIG. 11. In FIG. 11, graph (a) represents external quantum efficiency according to a current density. In FIG. 11, graph (b) represents extraction efficiency according to a current density.

In Example 1, the concentration of magnesium doped in the first region was $5 \times 10^{20}$ cm$^{-3}$, the concentration of magnesium doped in the second region was $2 \times 10^{20}$ cm$^{-3}$, and the concentration of magnesium doped in the third region was $5 \times 10^{19}$ cm$^{-3}$. In Comparative Example 1, the concentration of magnesium doped was uniformly $5 \times 10^{20}$ cm$^{-3}$ in the second conductive semiconductor layer 130.

Referring to FIG. 11, it may be seen that both extraction efficiency and external quantum efficiency were improved in Example 1, in which the second conductive semiconductor layer 130 was divided into the three regions and the concentrations of magnesium were different in the three regions, as compared to Comparative Example 1, in which the concentration of magnesium was uniform.

In the semiconductor light emitting device of an embodiment, the concentrations of magnesium may be different in stages in the three regions within the second conductive semiconductor layer 130, so that a difference in resistance between the adjacent regions may be decreased, thereby decreasing an operation voltage. For example, compared to a case where the concentration of magnesium doped within the second conductive semiconductor layer 130 is simply divided into two stages, light extraction efficiency may be improved and an operation voltage may be decreased, so that the semiconductor light emitting device may be economical.

In a case where the second conductive semiconductor layer 130 is divided into the three regions and the concentrations of magnesium of the three regions are different, when the SIMPS measurement is performed on the case, a gradient of a doping profile may be more steeply represented. For example, in the case where the second conductive semiconductor layer 130 is simply divided into the two regions and the concentrations of magnesium of the two regions are different, when the concentration of magnesium according to a thickness within the second conductive semiconductor layer is measured and a rate of change is calculated, $2.9 \times 10^{19}$ cm$^{-3}$/nm may be obtained. In the case where the second conductive semiconductor layer 130 is divided into the three regions and the concentrations of magnesium of the three regions are different, when the SIMPS measurement is performed on the case, a rate of change of the concentration of magnesium according to the thickness may be $3.5 \times 10^{19}$ cm$^{-3}$/nm, so that a gradient of the doping profile may be steeply represented compared to the case where the magnesium is doped in the two regions. The value of the rate of change is a value obtained by measuring a gradient at a predetermined point in the graph representing the concentration of magnesium according to a thickness.

As described above, in the semiconductor light emitting device of FIG. 10, the concentration of magnesium within the second conductive semiconductor layer 130 may be doped in stages, thereby improving light extraction efficiency and decreasing a driving voltage. Further, when the exemplary embodiment of FIG. 10 includes the characteristic disclosed in the exemplary embodiments of FIGS. 1 to 9, the semiconductor light emitting device may maximize light extraction efficiency by the reflection assisting layer 210 and the second conductive semiconductor layer 130 having a thickness of 45 nm to 100 nm.

Figure 12:
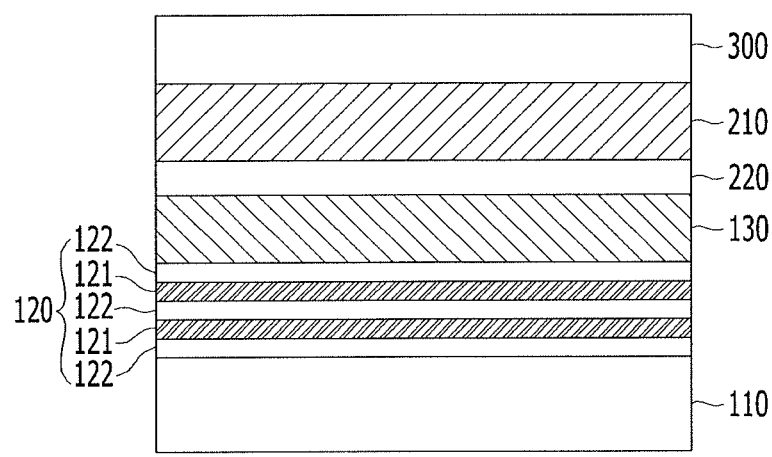
FIG. 12 illustrates a diagram of a part of a cross-section of a semiconductor light emitting device according to another exemplary embodiment.

FIG. 12 illustrates a part of a cross-section of a semiconductor light emitting device according to another exemplary embodiment. The semiconductor light emitting device of FIG. 12 may include all of the characteristics of the semiconductor light emitting devices described with reference to FIGS. 1 to 9. For example, the semiconductor light emitting device of FIG. 12 may include a reflection assisting layer 210, and a second conductive semiconductor layer 130 having a thickness of 45 nm to 100 nm. A repeated detailed description of the same constituent element may be omitted.

Figure 13:
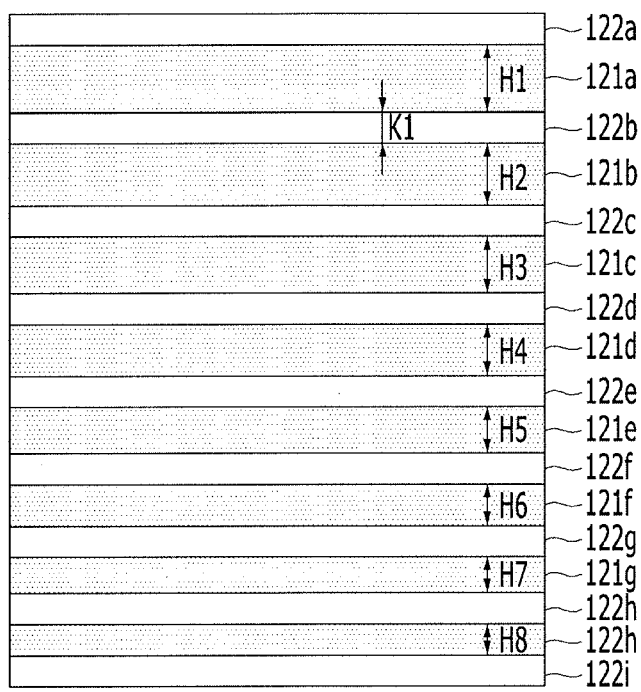
FIGS. 13 and 14 illustrate diagrams of only a cross-section of an active layer in the semiconductor light emitting device according to the exemplary embodiment of FIG. 12.
Figure 14:
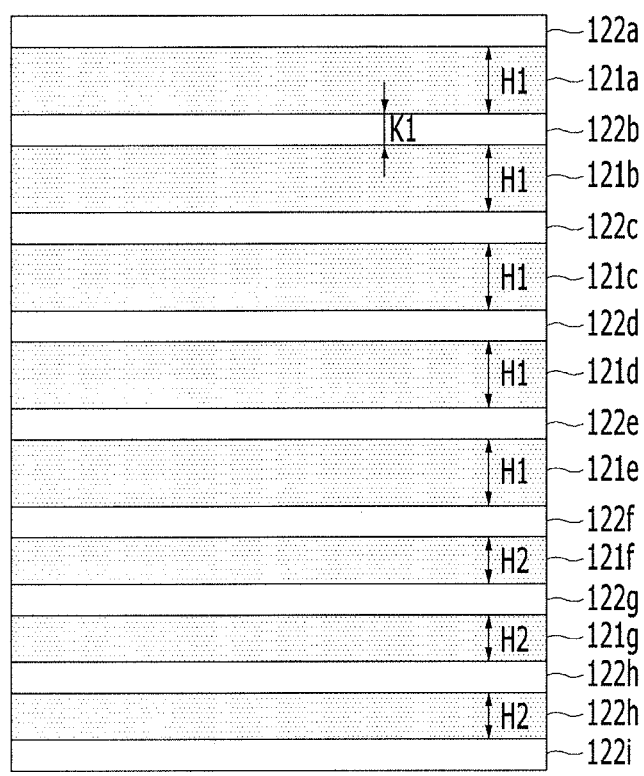

Referring to FIG. 12, in the semiconductor light emitting device, an active layer 120 may include a structure in which a plurality of quantum well layers 121 and a plurality of quantum barrier layers 122 are alternately laminated. FIGS. 13 and 14 illustrate only a cross-section of the active layer in the semiconductor light emitting device according to the exemplary embodiment of FIG. 12. In FIGS. 13 and 14, a second conductive semiconductor layer may be adjacent to a first quantum well layer 121a and a first quantum barrier layer 122a, and a first conductive semiconductor layer may be adjacent to an eighth quantum well layer 121h and a ninth quantum barrier layer 122i. In an implementation, as illustrated in FIGS. 8 and 9 the number of quantum well layers 121 may be, e.g., eight.

Referring to FIGS. 13 and 14, in the semiconductor light emitting device according to the present exemplary embodiment, a thickness of (e.g., each of) the plurality of quantum well layers 121 may be larger than a thickness of (e.g., each of) the plurality of quantum barrier layers 122. For example, a thickness of each of the plurality of quantum well layers 121 may be 4 nm to 5 nm, and a thickness K1 of each of the plurality of quantum barrier layers 122 may be 3.0 nm to 3.9 nm.

A region, from which light is discharged or emitted by a recombination of electrons and holes in the semiconductor light emitting device may be the quantum well layer 121 in the active layer 120. Accordingly, in order to maximize light emission efficiency, the quantum well layer 121 may be thick. If the quantum well layer 121 were to be too thick, an entire thickness of the active layer 120 may also increase, so that stress could be generated within the semiconductor light emitting device.

In the semiconductor light emitting device according to the present exemplary embodiment, the quantum barrier layer 122 may be thin, instead of forming the quantum well layer 121 to be thick, thereby maximizing light emission efficiency and minimizing stress by the active layer 120.

Further, referring to FIGS. 13 and 14, in the semiconductor light emitting device, a thickness of the first quantum well layer 121a adjacent to the second conductive semiconductor layer may be larger than a thickness of the eighth quantum well layer 121h adjacent to the first conductive semiconductor layer. A place in which the holes and the electrons are actually recombined, within the active layer 120 may be a region adjacent to the second conductive semiconductor layer, to which the holes are supplied, so that the first quantum well layer 121a that is the region, in which the holes and the electrons are much recombined, may be thick. Accordingly, it is possible to maximize light emission efficiency.

Referring to FIG. 13, a thickness of the quantum well layers 121 may gradually decrease moving away from the second conductive semiconductor layer, e.g., from the first quantum well layer 121a to the eighth quantum well layer 121h. As illustrated in FIG. 13, a thickness H1 of the first quantum well layer 121a may be larger than a thickness H8 of the eighth quantum well layer 121h. The thicknesses of the plurality of quantum well layers 121 may be gradually changed in the following manner, e.g., H1>H2>H3 . . . >H8.

In an implementation, some of the quantum well layers 121 adjacent or proximate to the second conductive semiconductor layer 130 may have the same first thickness H1, and some of the quantum well layers 121 adjacent or proximate to the first conductive semiconductor layer 110 have the same second thickness H2, and the first thickness H1 may be larger than the second thickness H2.

Referring to FIG. 14, the semiconductor light emitting device may include, e.g., a total of eight quantum well layers 121, and the first quantum well layer 121a to the fifth quantum well layer 121e may have the first thickness H1, the sixth quantum well layer 121f to the eighth quantum well layer 121h may have the second thickness H2, and the first thickness H1 may be larger than the second thickness H2. For example, the first thickness H1 may be 4 nm to 5 nm, and the second thickness H2 may be 3.5 nm to 3.9 nm. In this case, a thickness K1 of the quantum barrier layer 122 may be 3 nm to 3.4 nm.

As described above, in the semiconductor light emitting device of FIGS. 12 to 14, the thickness of the quantum well layer 121 of the active layer 120 may be larger than the thickness of the quantum barrier layer 122, and the thickness of the quantum well layer 121 may increase as the quantum well layer 121 with decreasing distance relative to the second conductive semiconductor layer 130. Accordingly, it is possible to maximize light emission efficiency in the quantum well layer 121, and to prevent stress by the thick active layer 120. Further, when the exemplary embodiment of FIGS. 12 to 14 includes the characteristic disclosed in the exemplary embodiments of FIGS. 1 to 9, the semiconductor light emitting device may also have an effect of maximizing light extraction efficiency by the reflection assisting layer 210 and the second conductive semiconductor layer 130 having a thickness of 45 nm to 100 nm.

The exemplary embodiment of FIGS. 12 to 14 may also include the characteristic disclosed in the exemplary embodiment of FIG. 10, in addition to the characteristics disclosed in the exemplary embodiments of FIGS. 1 to 9. In this case, the semiconductor light emitting device may include the second conductive semiconductor layer 130, in which magnesium is doped in stages, in addition to the aforementioned effect, thereby improving light extraction efficiency and decreasing a driving voltage.

Figure 15:
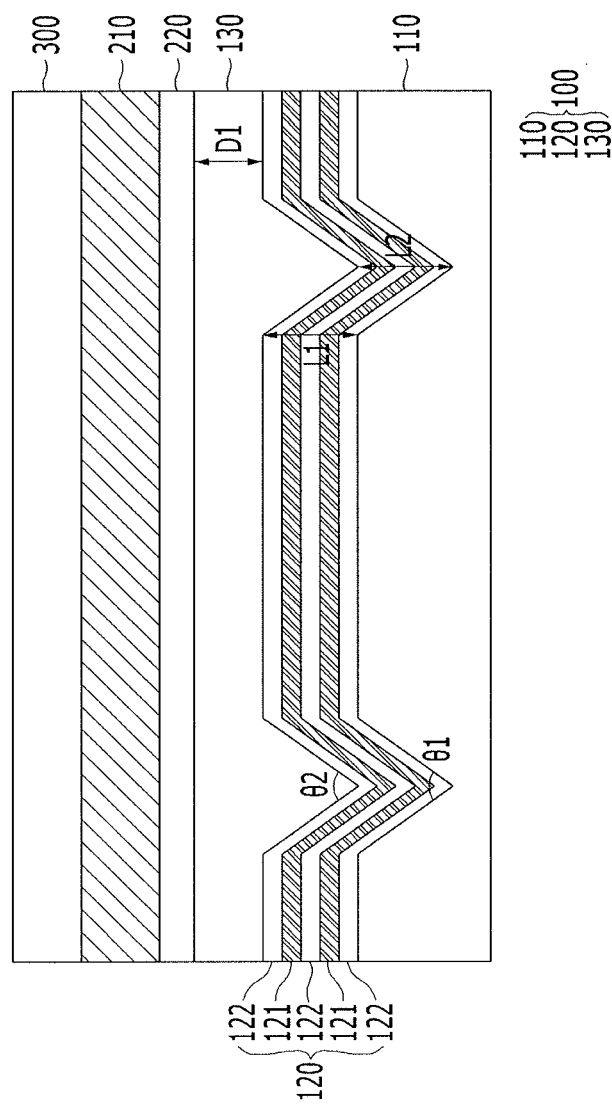
FIG. 15 illustrates a diagram of a part of a cross-section of a semiconductor light emitting device according to another exemplary embodiment.

FIG. 15 illustrates a part of a cross-section of a semiconductor light emitting device according to another exemplary embodiment. The semiconductor light emitting device according to FIG. 15 may include all of the characteristics of the semiconductor light emitting devices of FIGS. 1 to 9. For example, the semiconductor light emitting device of FIG. 15 may include a reflection assisting layer 210, and a second conductive semiconductor layer 130 having a thickness of 45 nm to 100 nm. A repeated detailed description of the same constituent element may be omitted.

Referring to FIG. 15, in the semiconductor light emitting device, a light emitting structure 100 may include a V-shaped recess. For example, a first conductive semiconductor layer 110, an active layer 120, and the second conductive semiconductor layer 130 include planar surfaces and inclined surfaces, and the inclined surfaces may form the V-shaped recess. FIG. 15 illustrates a cross-section of the semiconductor light emitting device, and a V-shaped cross-section is illustrated. In an implementation, the actual V-shaped recess in a three dimension may have a form similar to a cone or a pyramid (e.g., polypyramid). A width of the V-shaped recess may be 200 to 300 nm. The width may be a numerical value measured based on a portion, in which a width of the V-shaped recess is largest, in the cross-section illustrated in FIG. 13.

Referring to FIG. 15, the first conductive semiconductor layer 110 may include the planar surface and the inclined surface, and the inclined surface may form the V-shaped recess. In this case, a vertical angle of the V-shaped recess of the first conductive semiconductor layer 110 may be a first angle θ1. For example, as illustrated in FIG. 15, two inclined surfaces, which are positioned farthest within the V-shaped recess, may form the first angle θ1 (e.g., the peak or vertex of the V-shaped recess in the first conductive semiconductor layer 110 may have the first angle θ1. The V-shaped recess may have a form of a cone or a pyramid including a plurality of inclined surfaces, and the first angle θ1 may be an angle formed by two sides meeting at an apex of the cone or the pyramid in a cross-section passing through a center of the cone or the pyramid.

The active layer 120 may be positioned along a curve or surface of the first conductive semiconductor layer 110 (e.g., conformally) and may include the planar surface and the inclined surface, and the inclined surfaces may form the V-shaped recess (e.g., may be in the recess of the first conductive semiconductor layer 110). In this case, a vertical angle of the V-shaped recess of the active layer 120 may be a second angle θ2. For example, as illustrated in FIG. 15, two inclined surfaces, which are positioned farthest within the V-shaped recess, may form the second angle θ2. The second angle may be an angle formed by two sides meeting at an apex of the cone or the pyramid in a cross-section passing through a center of the cone or the pyramid.

Referring to FIG. 15, the first angle θ1 and the second angle θ2 may be substantially the same. In the present disclosure, the term of "substantially the same" means that two values are the same within a range of a process deviation generable during a process. In an implementation, a difference between the first angle θ1 and the second angle θ2 may be less than 10%.

In the case of the semiconductor light emitting device formed with the V-shaped recess, the V-shaped recess may be filled by the second conductive semiconductor layer 130, so that p-type impurities, such as Mg, may be diffused up to the active layer 120, and a high-resistance region by a P-N junction may be formed in a region of the V-shaped recess. Accordingly, the high-resistance region may smoothly supply a current to the active layer positioned in a flat region and suppress a non-emissive combination, thereby improving light emission efficiency. However, when the V-shaped recess is filled by the active layer 120, not the second conductive semiconductor layer 130, the high-resistance region may be difficult to be formed, and thus the semiconductor light emitting device may not have a light emission efficiency improvement effect.

In the semiconductor light emitting device according to the present exemplary embodiment, a thickness of the active layer 120 within the V-shaped recess may be uniform, and the V-shaped recess may not be filled by the active layer 120, so that it is possible to improve light emission efficiency.

For example, as illustrated in FIG. 15, a first thickness L1 of the active layer 120 at a corner, at which the planar surface and the inclined surface of the active layer 120 meet, may be substantially the same as a second thickness L2 at the vertex or bottom of the V-shaped recess of the active layer 120. In an implementation, a difference between the first thickness L1 and the second thickness L2 may be less than 10%. This means that the active layer 120 is not filled in the V-shaped recess and is uniformly grown, and it is possible to improve light emission efficiency.

The semiconductor light emitting device of FIG. 15 may include the characteristic disclosed in the exemplary embodiment of FIGS. 1 to 4, e.g., the semiconductor light emitting device includes the V-shaped recess, includes the reflection assisting layer 210, and includes the second conductive semiconductor layer 130 having a thickness of 45 nm to 100 nm. In this case, a thickness D1 of the second conductive semiconductor layer 130 may be based on a thickness measured in a planar surface, in which the V-shaped recess is not positioned, as illustrated in FIG. 10. The reason is that the planar region is actually wider than the region, in which the V-shaped recess is positioned, in the semiconductor light emitting device.

When the semiconductor light emitting device includes the V-shaped recess and the reflection assisting layer 210, and a thickness of the second conductive semiconductor layer 130 is 45 nm to 100 nm, light emission efficiency of the semiconductor light emitting device may be improved compared to a structure including no V-shaped recess. When the semiconductor light emitting device includes the V-shaped recess, the V-shaped recess may be filled with the second conductive semiconductor layer 130, and the second conductive semiconductor layer 130 inside the V-shaped recess may not be doped. Accordingly, a current may not flow inside the V-shaped recess, and hole injection performance may be concentrated at the region outside the V-shaped recess. When the second conductive semiconductor layer 130 is thin, it may be difficult to secure sufficient hole injection performance within the second conductive semiconductor layer 130 due to a small thickness. In the semiconductor light emitting device according to the present exemplary embodiment, hole injection performance may be concentrated at the region outside the V-shaped recess, so that it is possible to secure hole injection performance despite of the thin second conductive semiconductor layer 130. Accordingly, the second conductive semiconductor layer may have a thickness of 45 nm to 100 nm like the present exemplary embodiment, and it is possible to secure sufficient light emission efficiency.

The exemplary embodiment of FIG. 15 may also include the characteristic disclosed in the exemplary embodiment of FIG. 10, in addition to the characteristics disclosed in the exemplary embodiments of FIGS. 1 to 9, e.g., the semiconductor light emitting device according to the present exemplary embodiment may include the second conductive semiconductor layer 130, in which magnesium is doped in stages, in addition to the aforementioned effect, thereby improving light extraction efficiency and decreasing a driving voltage. Further, except for the characteristics disclosed in the exemplary embodiments of FIGS. 1 to 9, an exemplary embodiment, in which the exemplary embodiment of FIG. 10 is combined with the exemplary embodiment of FIG. 15, is also included in the present disclosure.

The exemplary embodiment of FIG. 15 may also include the characteristic disclosed in the exemplary embodiment of FIGS. 12 to 14, in addition to the characteristics disclosed in the exemplary embodiments of FIGS. 1 to 9, e.g., the semiconductor light emitting device according to the present exemplary embodiment includes a structure, in which the thickness of the quantum well layer 121 of the active layer 120 is larger than the thickness of the quantum barrier layer 122, and the thickness of the quantum well layer 121 is increased as the quantum well layer 121 is adjacent to the second conductive semiconductor layer 130. Accordingly, it is possible to maximize light emission efficiency in the quantum well layer, and prevent stress by the thick active layer 120. Except for the characteristics disclosed in the exemplary embodiments of FIGS. 1 to 9, an exemplary embodiment, in which the exemplary embodiment of FIGS. 12 to 14 is combined with the exemplary embodiment of FIG. 15, is also included in the present disclosure.

As described above, the semiconductor light emitting device according to the present disclosure includes may include, e.g., (1) the reflection assisting layer 210, and the second conductive semiconductor layer 130 having a thickness of 45 nm to 100 nm as illustrated in FIGS. 1 to 9, (2) the second conductive semiconductor layer 130, in which magnesium is doped in stages as illustrated in FIG. 10, (3) the active layer 120, in which a thickness of the quantum well layer 121 is larger than a thickness of the quantum barrier layer 122, and a thickness of the quantum well layer 121 is increased proximate to the second conductive semiconductor layer 130 as illustrated in FIGS. 11 to 14, or (4) the V-shaped recess structure, in which a thickness of the active layer is uniform within the V-shaped recess, as illustrated in FIG. 15.

Figure 16:
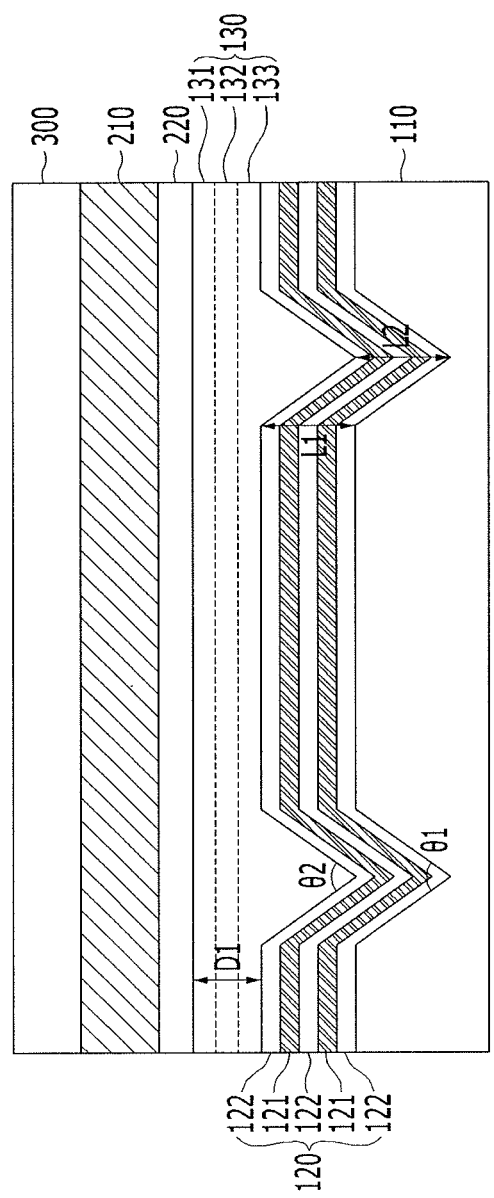
FIG. 16 illustrates a diagram of a part of a cross-section of a semiconductor light emitting device according to another exemplary embodiment.

FIG. 16 illustrates a part of a cross-section of a semiconductor light emitting device according to another exemplary embodiment, and illustrates an exemplary embodiment including all of the characteristics (1) to (4). A repeated detailed description of the aforementioned same constituent element may be omitted. Referring to FIG. 16, the semiconductor light emitting device according to the present exemplary embodiment may include a reflection assisting layer 210 and a transparent conductive layer 220, and a thickness D1 of the second conductive semiconductor layer 130 may be 45 nm to 100 nm. For example, the thickness D1 of the second conductive semiconductor layer 130 may be 45 nm to 60 nm. Accordingly, light amplified by constructive interference in the reflection assisting layer 210 may not be absorbed inside the second conductive semiconductor layer 130, thereby improving light emission efficiency.

The second conductive semiconductor layer 130 may include a first region 131 adjacent or proximate to a reflection layer 300, a third region 133 adjacent to an active layer 120, and a second region 132 between the first region 131 and the third region 133. The concentration of magnesium in the first region 131 may be two or more times of the concentration of magnesium of the second region 132, and the concentration of magnesium in the second region 132 may be two or more times of the concentration of magnesium of the third region 133. Accordingly, it is possible to help decrease contact resistance between the second conductive semiconductor layer 130 and the reflection layer 300, prevent light absorption by magnesium within the second conductive semiconductor layer 130 and improve efficiency, and decrease a driving voltage.

A thickness of a quantum well layer 121 of the active layer 120 may be larger than a thickness of a quantum barrier layer 122, and a thickness of the quantum well layer 121 may increase with increased proximity to the second conductive semiconductor layer 130. Accordingly, it is possible to maximize light emission efficiency in the quantum well layer 121, and prevent stress by the thick active layer 120.

The semiconductor light emitting device according to the present exemplary embodiment may include a V-shaped recess structure, and a thickness of the active layer 120 within a V-shaped recess may be uniform (e.g., a thickness of the active layer 120 outside of the recess may be the same as a thickness of the active layer 120 inside of the recess). Accordingly, even after the active layer is formed, it is possible to maintain a curve and/or an angle of the V-shaped recess, so that it is possible to help suppress a non-emissive combination and improve light emission efficiency.

A method of manufacturing a semiconductor light emitting device according to an exemplary embodiment will be described with reference to the drawings. FIGS. 17 to 21 illustrate cross-sectional views of stages in a process of manufacturing a semiconductor light emitting device according to an exemplary embodiment.

A method of manufacturing a semiconductor light emitting device according to the present exemplary embodiment may include forming a first conductive semiconductor layer 110 having the plurality of V-shaped recesses, forming an active layer 120 by alternately growing the plurality of quantum well layers 121 and the plurality of quantum barrier layers 122 on the first conductive semiconductor layer 110, and forming a second conductive semiconductor layer 130 on the active layer 120. In an implementation, the plurality of quantum barrier layers 122 may be grown at a temperature of 850° C. to 1,000° C. at a speed of 0.03 to 0.05 Å/sec. In an implementation, the plurality of quantum barrier layers 122 may also be grown at a temperature of 950 to 1,000° C. at a speed of 0.03 to 0.05 Å/sec. In an implementation, a width of the V-shaped recess may be 200 to 300 nm.

In an implementation, the first conductive semiconductor layer 110, the active layer 120, and the second conductive semiconductor layer 130 may be grown by using a semiconductor growth process, e.g., metal organic chemical vapor deposition (MOCVD), hydride vapor phase epitaxy (HVPE), and molecular beam epitaxy (MBE).

Figure 17:
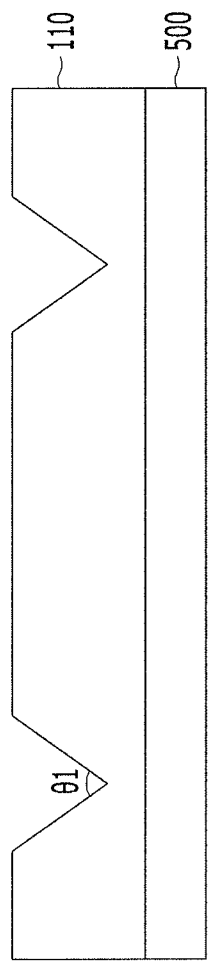
FIGS. 17 to 21 illustrate cross-sectional views of stages in a process of manufacturing a semiconductor light emitting device according to an exemplary embodiment.

First, the operation of forming the first conductive semiconductor layer 110 having the plurality of V-shaped recesses will be described with reference to FIG. 17.

The forming of the first conductive semiconductor layer 110 having the V-shaped recesses may be performed by a method of growing gallium nitride (GaN) in or on a substrate 500 at a low temperature.

In an implementation, a buffer layer may be interposed between the substrate 500 and the first conductive semiconductor layer 110. The buffer layer may help relieve a lattice defect between the substrate 500 and the first conductive semiconductor layer 110. In an implementation, $Al_m In_n Ga_{1-m-n}N$ (0≤m≤1, 0≤n≤1), e.g., GaN, AlN, and AlGaN, may be used as the buffer layer, and e.g., the buffer layer may be formed of an undoped GaN layer, in which a dopant is not doped, with a predetermined thickness.

In an implementation, a structure may help a semiconductor laminated body to have an excellent crystal property, and a suitable kind of structures may be adopted, and a material, such as $ZrB_2$, $HfB_2$, ZrN, HfN, TiN, and ZnO, may be used. Further, a combination of a plurality of layers, or a layer, of which a composition is gradually changed, may be used.

In an implementation, the first conductive semiconductor layer 110 may be grown at a low temperature. For example, when GaN is grown at a temperature of 200° C. to 300° C., a growth temperature may be a relatively low temperature, so that growth imbalance in a plane direction and a direction of a growth axis may be generated around a dislocation core. Accordingly, a region, in which GaN is not grown, may be created around the dislocation core, and the region becomes the V-shaped recess.

In the present operation, a vertical or vertex angle of the V-shaped recess of the first conductive semiconductor layer 110 may be a first angle θ1. For example, as illustrated in FIG. 17, two inclined surfaces, which are positioned farthest within the V-shaped recess, may form the first angle θ1.

Figure 18:
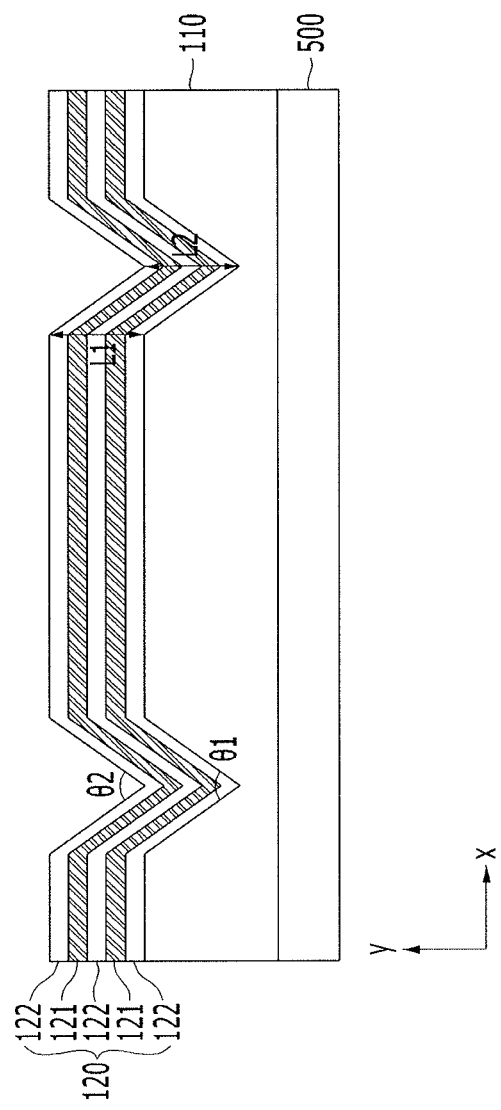

Next, referring to FIG. 18, the active layer 120 may be formed by alternately growing the plurality of quantum well layers 121 and the plurality of quantum barrier layers 122 on the first conductive semiconductor layer 110. In the present operation, the active layer 120 may be uniformly formed while maintaining a curve of the V-shaped recess formed in the first conductive semiconductor layer 110, e.g., the active layer 120 may be conformally formed to also include a V-shaped recess therein.

In the present operation, the quantum well layers 121 and the quantum barrier layers 122 in the active layer 120 may be alternately formed. In this case, after the quantum barrier layer 122 are formed first, the quantum well layer 121 may be formed. In the exemplary embodiment, the quantum well layer 121 may include InGaN, and the quantum barrier layer 122 may include GaN.

In the present operation, the quantum barrier layer 122 is grown at a temperature of 850° C. to 1,000° C. at a speed of 0.03 to 0.05 Å/sec. In the present disclosure, the growth speed of 0.03 to 0.05 Å/sec is based on a thickness of the quantum barrier layer, which means that a thickness of the quantum barrier layer is increased by 0.03 to 0.05 Å per second.

Accordingly, it is possible to maintain a shape of the V-shaped recess by growing the quantum barrier layer 122 at a high speed. For example, during a process of forming the quantum barrier layer 122, the quantum barrier layer 122 may be grown in a first direction (a y-axis direction, a vertical direction), but when the quantum barrier layer 122 is grown at a high temperature, the quantum barrier layer 122 may also in a second direction (an x-axis direction, a horizontal direction), and the shape of the V-shaped recess may not be maintained and the V-shaped recess may be filled (e.g., completely filled) by the active layer 120 (e.g., such that the active layer 120 may not include the V-shaped recess. In the method of manufacturing the semiconductor light emitting device, the quantum barrier layer 122 may be formed at a high speed, so that it is possible to maintain a structure of the V-shaped recess. For example, a horizontal growth of the quantum barrier layer 122 may be suppressed, and the active layer 120 may be evenly grown within the V-shaped recess in the vertical direction and a thickness of the active layer 120 is uniform within the V-shaped recess. Accordingly, a first thickness L1 of the active layer 120 at a corner, at which the plane surface and the inclined surface of the active layer 120 meet, may be substantially the same as a second thickness L2 at the vertex of the V-shaped recess of the active layer 120.

When the semiconductor light emitting device is manufactured as described above, the non-uniform horizontal growth of the active layer 120 may be suppressed, so that the active layer 120 may be evenly grown in the vertical direction, and the shape of the V-shaped recess formed in the first conductive semiconductor layer 110 may be maintained as it is after the active layer 120 is formed. For example, a vertical angle of the V-shaped recess of the active layer 120 may be a second angle θ2. In this case, the first angle θ1 may be substantially the same as the second angle θ2. For example, a difference between the first angle θ1 and the second angle θ2 may be less than 10%.

In the present operation, the quantum well layer 121 may include InGaN, and the quantum barrier layer may include GaN. The quantum well layer 121 may be formed at a temperature of, e.g., 600° C. to 800° C. In this case, an indium cluster could be formed on a surface of the quantum well layer 121, so that the surface may not be flat, and the indium cluster may become a defect of the semiconductor light emitting device, thereby facilitating the non-emissive combination in the active layer 120 and decreasing light emission efficiency. In order to planarize the non-uniform surface by the indium cluster, the quantum barrier layer 122 could be grown at a high temperature condition, the growth of the quantum barrier layer 122 in the horizontal direction may be facilitated when the quantum barrier layer 122 is grown at a high temperature, and the V-shaped recess structure could be filled.

When the quantum barrier layer 122 is grown at a high temperature and a high speed like the present disclosure, the indium cluster may be removed, the horizontal growth of the quantum barrier layer 122 may be suppressed by the high-speed growth, and the filling of the V-shaped recess structure, may be prevented.

In addition, in the present operation, the active layer 120 may also be formed so that a thickness of the quantum well layer 121 is larger than a thickness of the quantum barrier layer 122, and a thickness of the quantum well layer 121 may increase or be greater closer to the second conductive semiconductor layer 130. In the present exemplary embodiment, each of the quantum well layers 121 may be formed with a thickness of 4 nm to 5 nm, and each of the quantum barrier layers 122 may be formed with a thickness of 3.5 nm to 3.9 nm.

Figure 19:
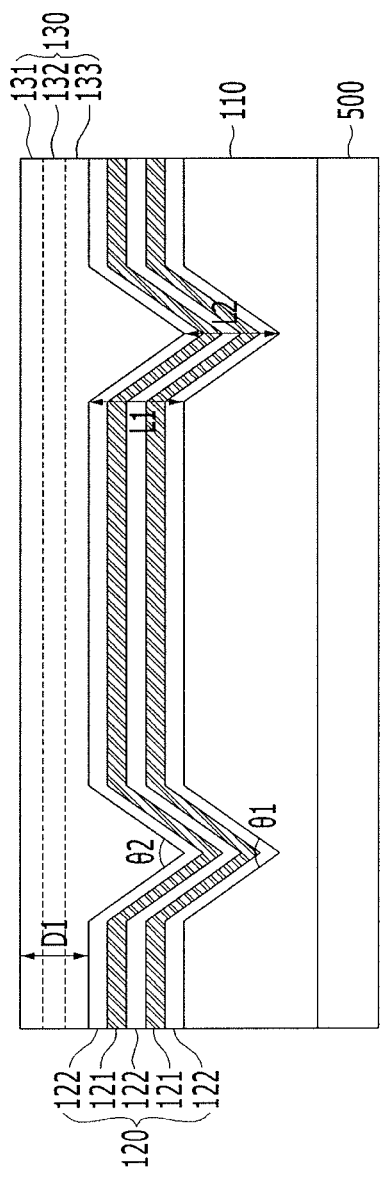

Next, referring to FIG. 19, the second conductive semiconductor layer 130 may be formed on the active layer 120. In the present operation, the second conductive semiconductor layer 130 may be formed by filling the V-shaped recess in the active layer 120. For example, one surface of the second conductive semiconductor layer 130, which is not in contact with the active layer 120, may have a flat surface.

As illustrated in FIG. 19, a thickness of the second conductive semiconductor layer 130 may be different between the region, in which the V-shaped recess is filled, and the plane region. The thickness D1 in the present disclosure is a thickness of the plane region of the second conductive semiconductor layer 130 as illustrated in FIG. 16.

The second conductive semiconductor layer 130 may include Mg-doped GaN. In an implementation, the concentration of Mg doped may be different according to a region of the second conductive semiconductor layer 130. For example, the second conductive semiconductor layer 130 may be divided into a third region 133, a second region 132, and a first region 131 in an order of closeness to the active layer 120, and the concentration of magnesium in the first region 131 may be two or more times the concentration of magnesium in the second region 132, and the concentration of magnesium in the second region 132 may be two or more times the concentration of magnesium in the third region 133.

The thickness D1 of the second conductive semiconductor layer 130 formed in the present operation may be 45 nm to 100 nm. In an implementation, the thickness D1 of the second conductive semiconductor layer may be 45 nm to 80 nm. In an implementation, the thickness of the second conductive semiconductor layer 130 may be 45 nm to 60 nm.

Figure 20:
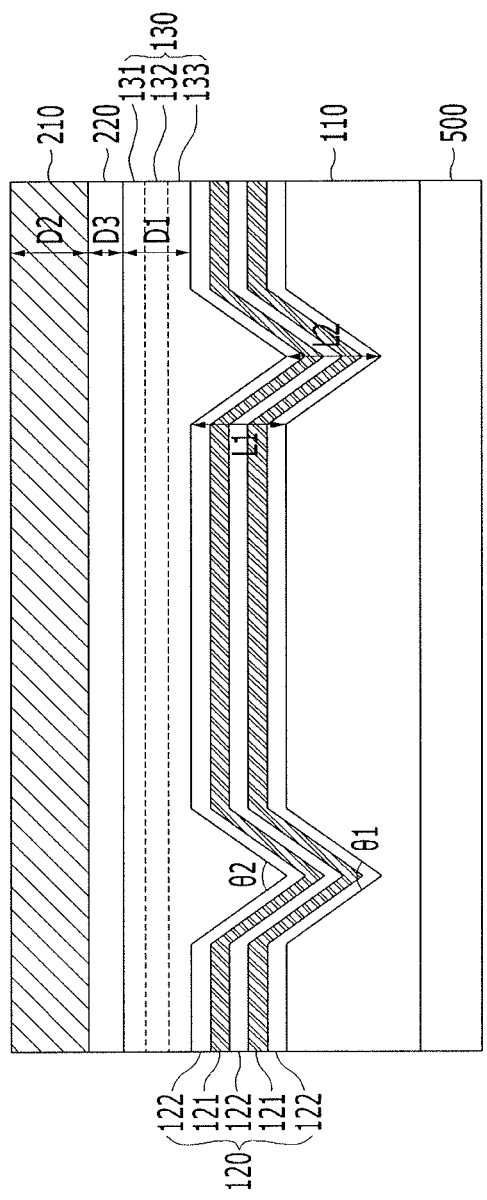

Next, referring to FIG. 20, a transparent conductive layer 220 and a reflection assisting layer 210 may be formed on the second conductive semiconductor layer 130. The transparent conductive layer 220 may have a thickness D3 of 10 nm to 20 nm. In an implementation, the transparent conductive layer 220 may be omitted.

The reflection assisting layer 210 may include, e.g., $SiO_2$, $Si_3N_4$, or $MgF_2$, and a thickness D2 of the reflection assisting layer 210 may be 500 nm to 700 nm.

Figure 21:
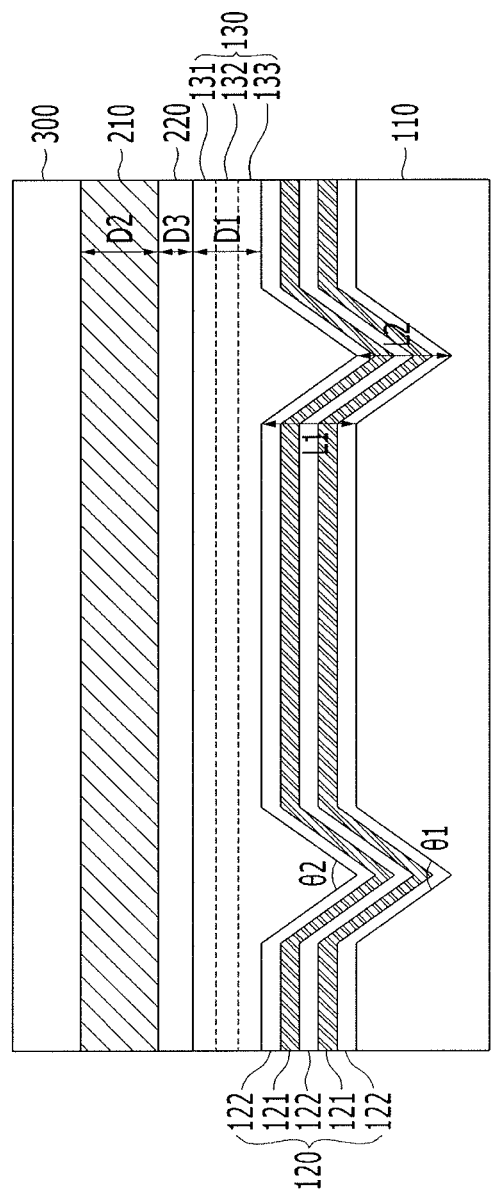

Next, referring to FIG. 21, the reflection layer 300 may be formed on the reflection assisting layer 210, and the substrate 500 may be removed. The reflection layer 300 may include, e.g., silver, aluminum, rhodium, palladium, gold, chromium, titanium, copper, or an alloy thereof. The substrate 500 may be removed by a laser lift off process or a chemical lift off process, and the substrate 500 may be removed after the reflection layer 300 is formed.

As described above, the semiconductor light emitting device according to the present disclosure may help maximize light reflected from the reflection layer 300 by constructive interference by adopting the reflection assisting layer 210, and may help improve light extraction efficiency by adjusting a thickness of the second conductive semiconductor layer 130 so as to help prevent amplified light from being absorbed inside the second conductive semiconductor layer 130. Further, the semiconductor light emitting device according to the present disclosure may help decrease contact resistance of the second conductive semiconductor layer 130 and may help decrease a driving voltage, and may help suppress light absorption by magnesium inside the second conductive semiconductor layer 130 by doping magnesium with the different concentration for each region of the second conductive semiconductor layer 130. Further, the semiconductor light emitting device according to the present disclosure may help maximize light generation efficiency and decrease stress by forming the quantum barrier layer 122 of the active layer 120 to be thinner than the quantum well layer 121, and forming the quantum well layer 121 in a region close to the second conductive semiconductor layer 130 to be thicker than the quantum well layer 121 in a region close to the first conductive semiconductor layer 110. Further, the light emitting structure 100 may include the V-shaped recess structure, so that it is possible to uniformly maintain a thickness of the active layer 120 within the V-shaped recess, thereby suppressing a non-emissive combination and improving light emission efficiency.

Further, in the method of manufacturing the semiconductor light emitting device according to the present disclosure, the quantum barrier layer 122 of the active layer 120 may be manufactured so as to be grown at a speed of 0.03 to 0.05/sec at a temperature of 850° C. to 1,000° C., so that it is possible to form the active layer 120 to have a uniform thickness within the V-shaped recess structure, remove an indium cluster of the quantum well layer 121, and solve a problem in that the quantum barrier layer 122 is horizontally grown and the V-shaped recess is filled.

By way of summation and review, light emission efficiency of the semiconductor light emitting device may be represented with a multiplication of internal quantum efficiency and light extraction efficiency. In this case, the internal quantum efficiency may be determined by a quality of semiconductor used, a structure of the light emitting device, and current injection efficiency, and the light extraction efficiency may be determined by a rate of a discharge of generated light to the outside of a semiconductor layer. Accordingly, even though the devices having the same internal quantum efficiency are manufactured, light emission efficiency thereof may be different according to light extraction efficiency.

The largest obstructive factor in the emission of light to the outside of the device may be internal total reflection, and total reflection may be generated on an interface by a difference in a refractive index between respective layers of the device, and only a part of the generated light may be discharged to the outside of the light emitting device. Further, light, which fails to be discharged to the outside of the light emitting device, could cause heat while moving inside the device, and increase the quantity of heat generated of the device to decrease life of the device.

As an example of a structure of the light emitting device, a flip chip bonding structure, in which the light emitting device is inverted, so that a substrate faces in an up direction, may be adopted, a reflection layer may be provided on a rear surface, and generated light may be discharged to the substrate. However, during a process of extracting light generated in an active layer through the substrate by the reflection layer, light may be influenced by a refractive index of each layer, so that light could not be totally extracted and light emission efficiency may be decreased.

The embodiments may provide a semiconductor light emitting device with improved light extraction efficiency, and a method of manufacturing the same.

According to the present disclosure, it is possible to help improve light extraction efficiency of the semiconductor light emitting device by introducing the reflection layer and appropriately adjusting a thickness of the second conductive semiconductor layer. Further, according to the present disclosure, it is possible to form the quantum well layer and the quantum barrier layer of the active layer within the V-shaped recess with uniform thicknesses.

DESCRIPTION OF SYMBOLS

| | | | |
|---|---|---|---|
| 100: | Light emitting structure | 110: | First conductive semiconductor layer |
| 120: | Active layer | 121: | Quantum well layer |
| 122: | Quantum barrier layer | 130: | Second conductive semiconductor layer |
| 210: | Reflection assisting layer | 220: | Transparent conductive layer |
| 230: | Adhesive layer | 300: | Reflection layer |

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor light emitting device, comprising:
a first conductive semiconductor layer including a plurality of V-shaped recesses;
an active layer on the first conductive semiconductor layer along a shape of the plurality of V-shaped recesses;
a second conductive semiconductor layer on the active layer;
a reflection assisting layer on the second conductive semiconductor layer;
a reflection layer disposed on the reflection assisting layer and connected to the second conductive type semiconductor layer;
an insulating layer disposed on the reflection layer;
a first metal layer disposed on the insulating layer and connected to the first conductive semiconductor layer; and
a second metal layer disposed on the insulating layer and connected to the reflection layer,
wherein a thickness of the second conductive semiconductor layer is 45 nm to 100 nm.

2. The semiconductor light emitting device as claimed in claim 1, wherein:
two inclined surfaces of the first conductive semiconductor layer, which are positioned farthest from each other within the V-shaped recesses of the first conductive semiconductor layer, form a first angle, and
two inclined surfaces of the active layer, which are positioned farthest from each other within the V-shaped recesses of the active layer, form a second angle, and a difference between the first angle and the second angle is less than 10%.

3. The semiconductor light emitting device as claimed in claim 1, wherein a difference between a thickness of the active layer at a point at which a planar surface and an inclined surface of the active layer meet and a thickness of the active layer at a vertex of the V-shaped recesses of the active layer is less than 10%.

4. The semiconductor light emitting device as claimed in claim 1, wherein:
the second conductive semiconductor layer is filled inside the V-shaped recesses positioned in the active layer, and
the V-shaped recesses are not positioned in a surface in which the second conductive semiconductor layer is in contact with the reflection assisting layer.

5. The semiconductor light emitting device as claimed in claim 1, further comprising a transparent conductive layer between the reflection assisting layer and the second conductive semiconductor layer.

6. The semiconductor light emitting device as claimed in claim 1, further comprising an adhesive layer between the reflection assisting layer and the reflection layer.

7. The semiconductor light emitting device as claimed in claim 5, further comprising a passivation pattern layer between the transparent conductive layer and the second conductive semiconductor layer.

8. The semiconductor light emitting device as claimed in claim 1, wherein:
the second conductive semiconductor layer includes a nitride semiconductor material and magnesium, and
a concentration of magnesium in the second conductive semiconductor layer increases closer to the reflection layer.

9. The semiconductor light emitting device as claimed in claim 1, wherein:
the first conductive semiconductor layer includes an n-type nitride semiconductor material, and the second conductive semiconductor layer includes a p-type nitride semiconductor material,
the active layer has a structure in which a plurality of quantum well layers and a plurality of quantum barrier layers are alternately laminated,
a thickness of the plurality of quantum well layers is larger than a thickness of plurality of the quantum barrier layers, and
a thickness of a quantum well layer of the plurality of quantum well layers adjacent to the second conductive semiconductor layer is larger than a thickness of a quantum well layer of the plurality of quantum well layers adjacent to the first conductive semiconductor layer.

10. The semiconductor light emitting device as claimed in claim 9, wherein:
the plurality of quantum well layers includes eight or more quantum well layers,
a first quantum well layer to a fifth quantum well layer adjacent to the second conductive semiconductor layer have a first thickness, and a sixth quantum well layer to an eighth quantum well layer adjacent to the first conductive semiconductor layer have a second thickness, and
the first thickness is larger than the second thickness.

11. A semiconductor light emitting device, comprising:
a first conductive semiconductor layer;
an active layer on the first conductive semiconductor layer;
a second conductive semiconductor layer on the active layer;
a reflection assisting layer on the second conductive semiconductor layer; and
a reflection layer on the reflection assisting layer,
wherein a thickness of the second conductive semiconductor layer in mm (T), a refractive index of a material of the second conductive semiconductor layer (n), and a wavelength of light emitted by the active layer in nm ($\lambda$) satisfy the following relation:

$$0.2 < ((T \times n)/\lambda) < 0.4.$$

12. The semiconductor light emitting device as claimed in claim 11, wherein a thickness of the reflection assisting layer is 500 nm to 700 nm.

13. The semiconductor light emitting device as claimed in claim 11, wherein:
the second conductive semiconductor layer includes a nitride semiconductor material and magnesium, and
a concentration of magnesium in the second conductive semiconductor layer increases with increasing proximity to the reflection layer.

14. The semiconductor light emitting device as claimed in claim 11, wherein:
the first conductive semiconductor layer includes an n-type nitride semiconductor material,
the second conductive semiconductor layer includes a p-type nitride semiconductor material,
the active layer has a structure in which a plurality of quantum well layers and a plurality of quantum barrier layers are alternately laminated,
a thickness of each quantum well layer of the plurality of quantum well layers is larger than a thickness of each quantum barrier layer of the plurality of the quantum barrier layers, and
a thickness of a quantum well layer of the plurality of quantum well layers that is adjacent to the second conductive semiconductor layer is larger than a thickness of a quantum well layer of the plurality of quantum well layers that is adjacent to the first conductive semiconductor layer.

* * * * *

UNITED STATES PATENT AND TRADEMARK OFFICE
CERTIFICATE OF CORRECTION

Page 1 of 1

PATENT NO. : 10,236,414 B2
APPLICATION NO. : 15/718484
DATED : March 19, 2019
INVENTOR(S) : Dong Yul Lee et al.

It is certified that error appears in the above-identified patent and that said Letters Patent is hereby corrected as shown below:

In the Specification

Column 1, Line 67 change "mm" to --nm--;

In the Claims

Column 26, Lines 10-24 should read:
11. A semiconductor light emitting device, comprising:
a first conductive semiconductor layer;
an active layer on the first conductive semiconductor layer;
a second conductive semiconductor layer on the active layer;
a reflection assisting layer on the second conductive semiconductor layer; and
a reflection layer on the reflection assisting layer,
wherein a thickness of the second conductive semiconductor layer in nm (T), a refractive index of a material of the second conductive semiconductor layer (n), and a wavelength of light emitted by the active layer in nm satisfy the following relation:
*0.2<((Txn)O,)<0.4.*

Signed and Sealed this
Twenty-sixth Day of January, 2021

Drew Hirshfeld
*Performing the Functions and Duties of the
Under Secretary of Commerce for Intellectual Property and
Director of the United States Patent and Trademark Office*